(12) United States Patent
Iwata

(10) Patent No.: US 7,158,406 B2
(45) Date of Patent: Jan. 2, 2007

(54) DATA WRITE METHOD OF MAGNETIC RANDOM ACCESS MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 11/052,810

(22) Filed: Feb. 9, 2005

(65) Prior Publication Data

US 2006/0133136 A1 Jun. 22, 2006

(30) Foreign Application Priority Data

Dec. 22, 2004 (JP) ............... 2004-371870

(51) Int. Cl.
*G11C 11/00* (2006.01)
(52) U.S. Cl. ...................... 365/158; 365/157
(58) Field of Classification Search ................. 365/158
See application file for complete search history.

(56) References Cited

U.S. PATENT DOCUMENTS

| | | | |
|---|---|---|---|
| 5,940,319 A | 8/1999 | Durlam et al. | |
| 5,953,248 A | 9/1999 | Chen et al. | |
| 6,134,139 A | 10/2000 | Bhattacharyya et al. | |
| 6,545,906 B1 | 4/2003 | Savtchenko et al. | |
| 6,633,498 B1 | 10/2003 | Engel et al. | |
| 6,667,899 B1 | 12/2003 | Subramanian et al. | |
| 6,693,824 B1 | 2/2004 | Nahas et al. | |
| 6,714,440 B1 | 3/2004 | Subramanian et al. | |
| 2004/0027854 A1 | 2/2004 | Iwata et al. | |
| 2004/0196693 A1 | 10/2004 | Iwata | |
| 2004/0252551 A1 | 12/2004 | Iwata et al. | |
| 2006/0017082 A1* | 1/2006 | Fukuzumi et al. | ........... 257/295 |

OTHER PUBLICATIONS

Roy Scheuerlein, et al., "A 10ns Read and Write Non-Volatile Memory Array Using a Magnetic Tunnel Junction FET Switch in each Cell", IEEE ISSCC Digest of Technical Papers, Feb. 8, 2000, pp. 94-95, 128-129 and 409-410.
U.S. Appl. No. 11/052,810, filed Feb. 9, 2005, Iwata.
U.S. Appl. No. 11/067,670, filed Mar. 1, 2005, Ikegawa et al.
U.S. Appl. No. 10/807,454, filed Mar. 23, 2004, Yoshihisa Iwata et al.
U.S. Appl. No. 10/873,929, filed Jun. 23, 2004, Yoshihisa Iwata.
U.S. Appl. No. 11/305,203, filed Dec. 19, 2005, Iwata et al.

* cited by examiner

*Primary Examiner*—Thong Q. Le
(74) *Attorney, Agent, or Firm*—Oblon, Spivak, McClelland, Maier & Neustadt, P.C.

(57) ABSTRACT

A data write method of a magnetic random access memory including a magnetoresistive element which has axis of easy and hard magnetizations, a first write wiring which runs in a direction of the axis of easy magnetization, and a second write wiring which runs in a direction of the axis of hard magnetization, includes a first phase of supplying a first current to the first write wiring in a first direction and supplying a second current to the second write wiring in a second direction, a second phase of stopping supplying the first current to the first write wiring and supplying the second current to the second write wiring in the second direction, and a third phase of supplying the first current to the first write wiring in a third direction reverse to the first direction and supplying the second current to the second write wiring in the second direction.

20 Claims, 26 Drawing Sheets

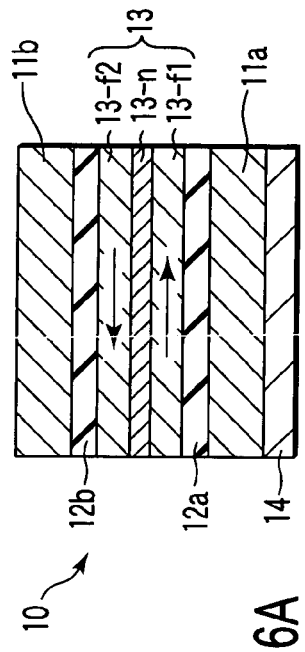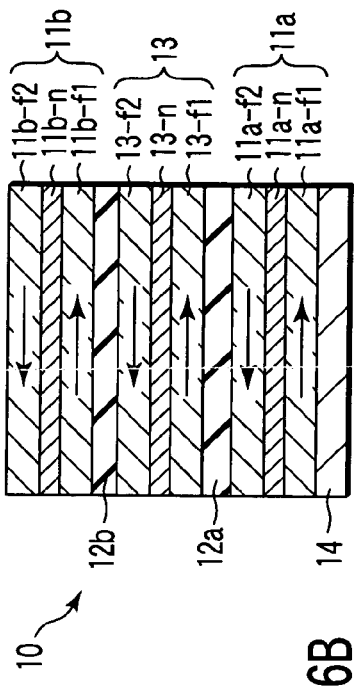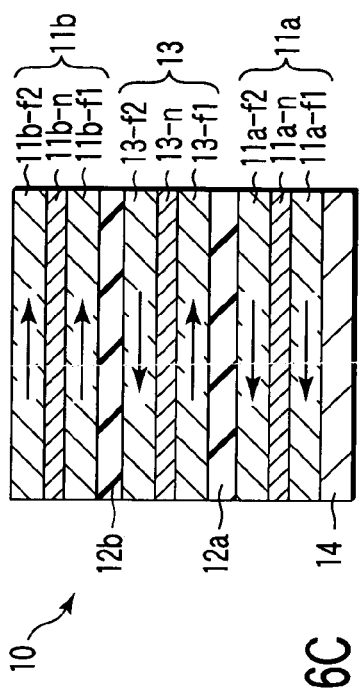
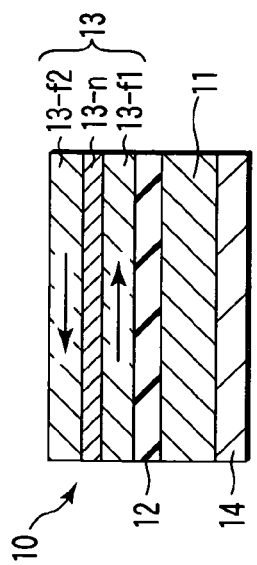
FIG. 5A
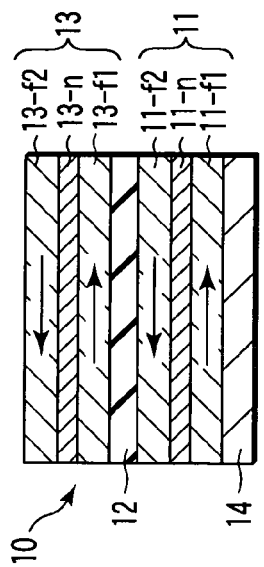
FIG. 5B
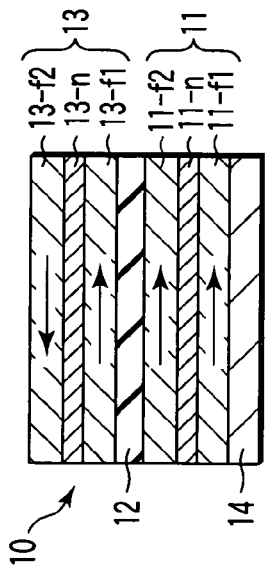
FIG. 5C
FIG. 6A
FIG. 6B
FIG. 6C

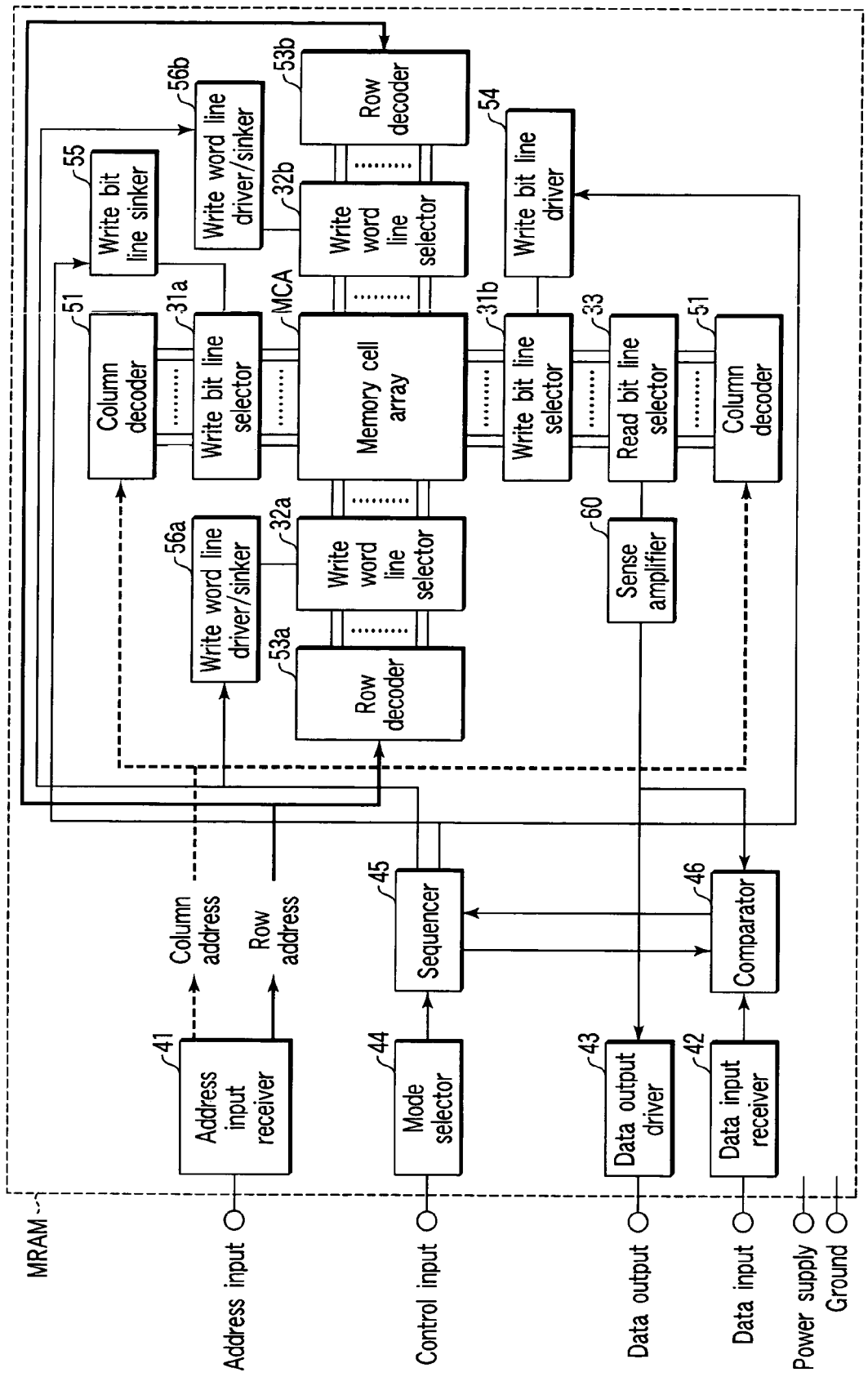
F I G. 24

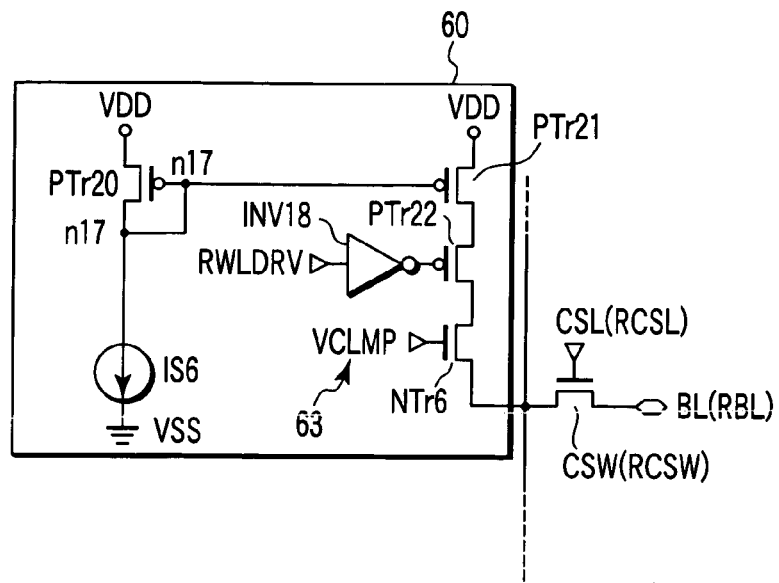
F I G. 34
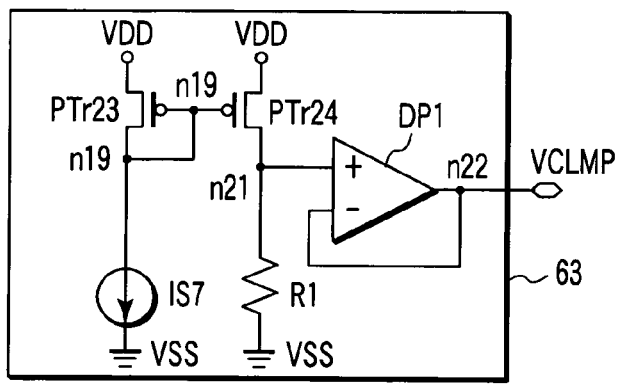
F I G. 35
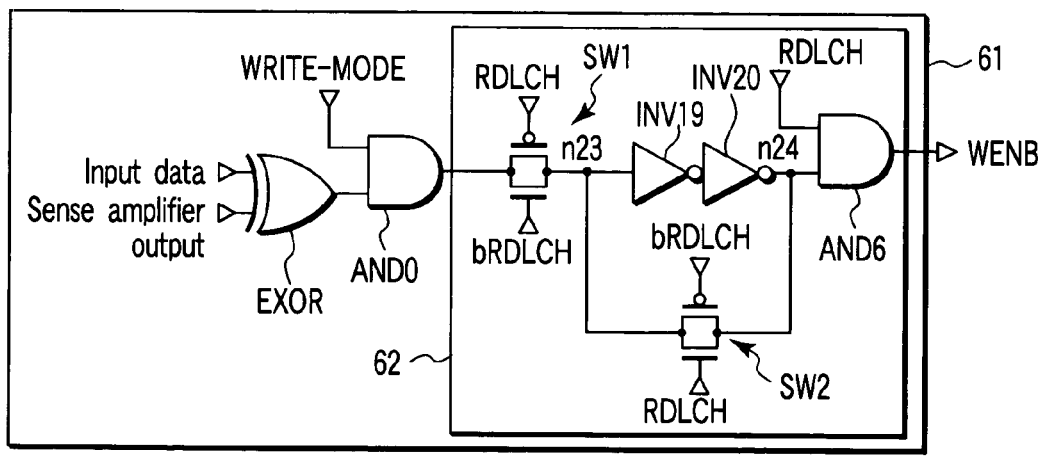
F I G. 36

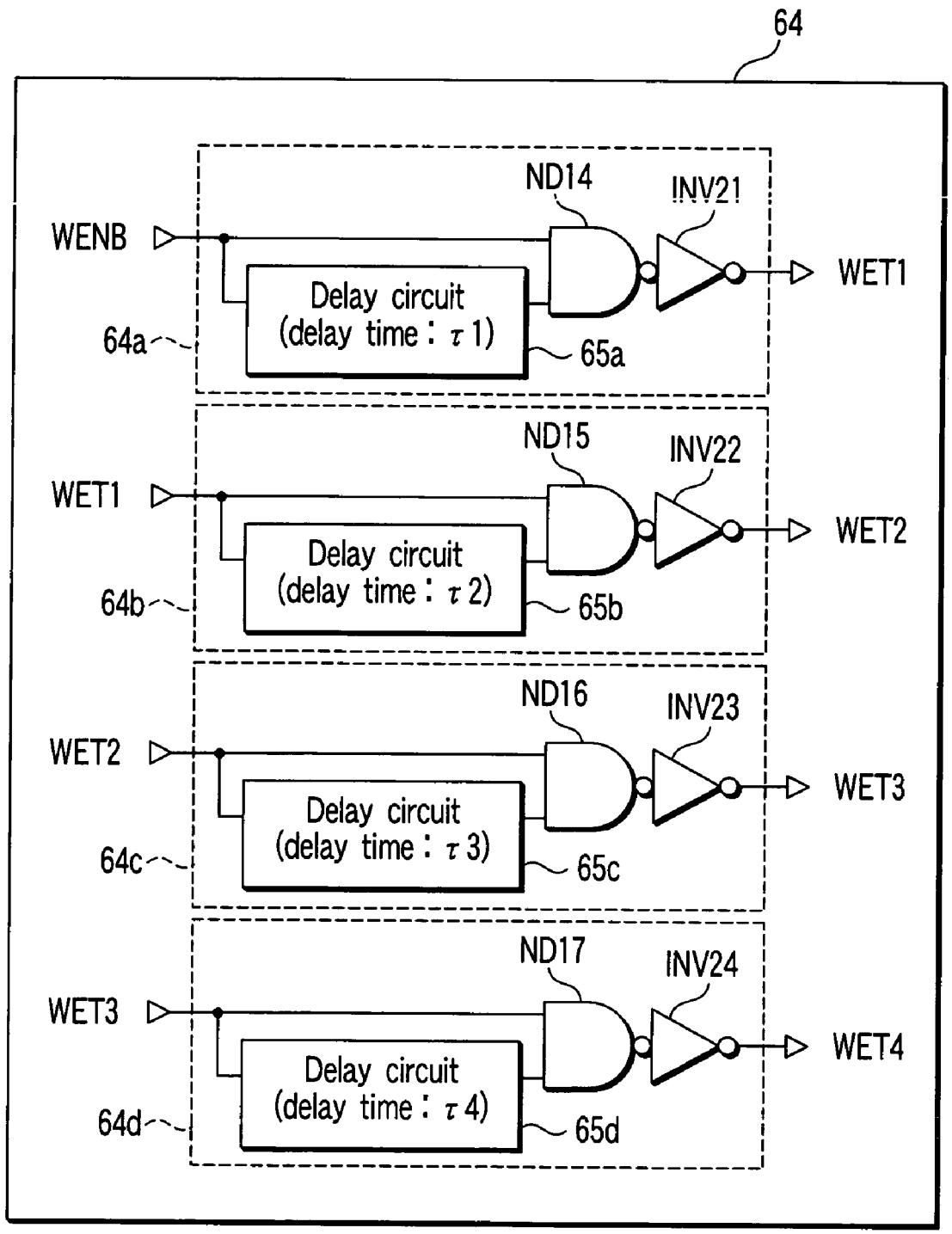
F I G. 37

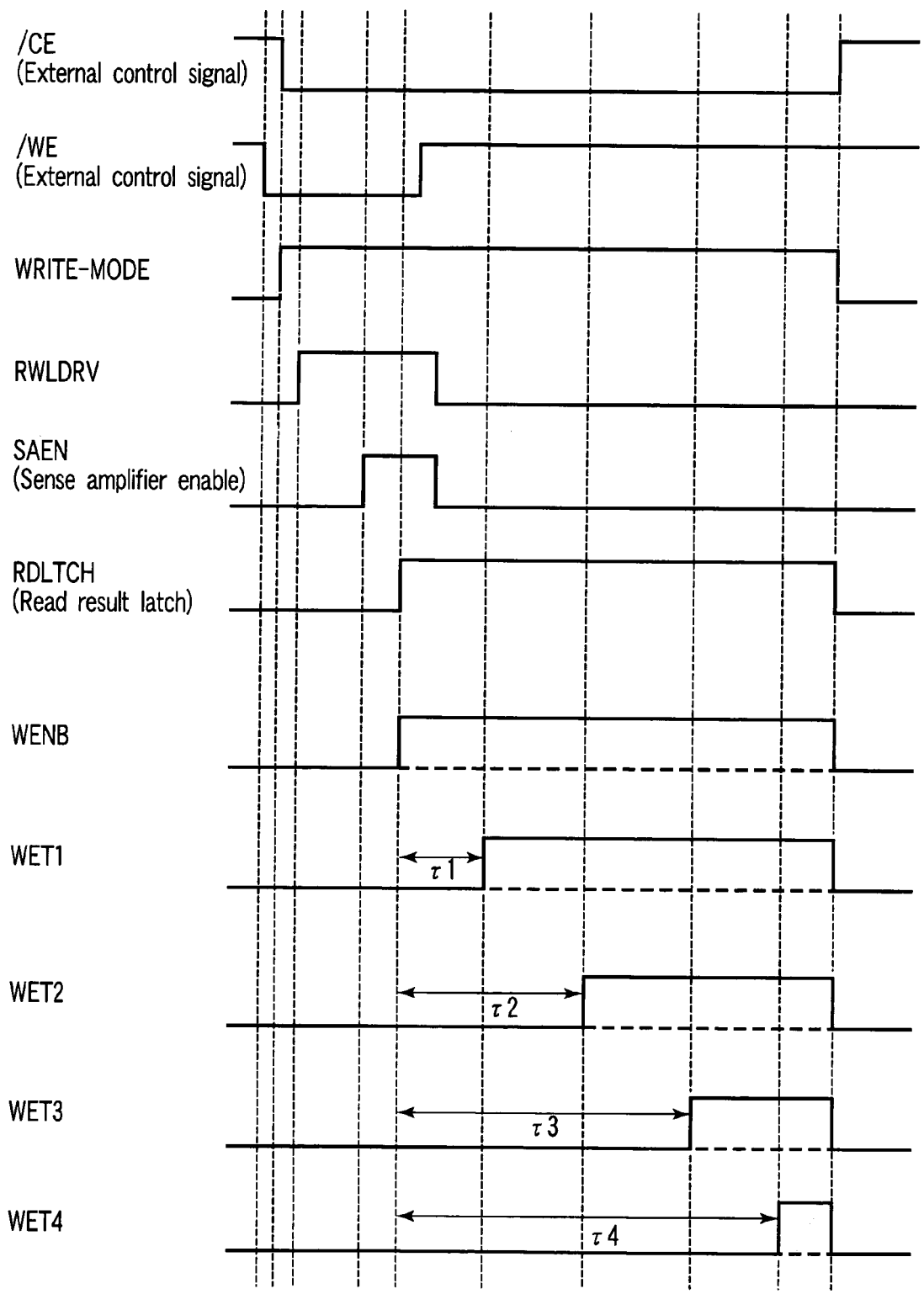
F I G. 40

DATA WRITE METHOD OF MAGNETIC RANDOM ACCESS MEMORY

CROSS-REFERENCE TO RELATED APPLICATIONS

This application is based upon and claims the benefit of priority from prior Japanese Patent Applications No. 2004-371870, filed Dec. 22, 2004, the entire contents of which are incorporated herein by reference.

BACKGROUND OF THE INVENTION

1. Field of the Invention

The present invention relates to a data write method of an MRAM (Magnetic Random Access Memory) which uses, as a memory cell, a structure to store "1" or "0" information by using the magnetoresistive effect.

2. Description of the Related Art

In recent years, MRAMs (Magnetic Random Access Memories) using the tunneling magnetoresistive (to be referred to as TMR hereinafter) effect have been proposed as information memory elements (e.g., Roy Scheuerlein, et al., "A 10 ns Read and Write Non-Volatile Memory Array Using a Magnetic Tunnel Junction and FET Switch in each Cell", ISSCC 2000 Technical Digest, p. 128).

An MTJ (Magnetic Tunnel Junction) element which exhibits TMR has an insulating film sandwiched between two ferromagnetic thin films. The MTJ element can create two states, i.e., a parallel state in which the magnetization directions of the upper and lower ferromagnetic materials are parallel to each other and an anti-parallel state in which the ferromagnetic materials are anti-parallel.

When the magnetization directions of the upper and lower ferromagnetic materials are parallel, the tunnel resistance of a current which flows to the thin insulating film sandwiched between the ferromagnetic materials is the lowest. This state is defined as, e.g., "1". On the other hand, when the magnetization directions of the upper and lower ferromagnetic materials are anti-parallel, the tunnel resistance is the highest. This state is defined as, e.g., "0". In this way, "1" or "0" information can be stored in the MTJ element.

A write in the MTJ element is executed by supplying a current to two write wirings perpendicular to each other and causing magnetization reversal in an MTJ element arranged at the intersection between the write wirings by generated magnetic fields. According to a coherent reversal model by Stoner-Wohlfarth, the energy necessary for causing magnetization reversal in the ferromagnetic material of the recording layer of the MTJ element is the lowest when a magnetic field is applied in a direction having an angle of 45° or 135° with respect to the direction of axis of easy magnetization of the recording layer. Hence, when the write wirings are arranged respectively in directions parallel and perpendicular to the direction of axis of easy magnetization, and a current is supplied to them, magnetization reversal can be caused in only the MTJ element located at the intersection between them. When MTJ elements are arrayed in a matrix on a two-dimensional plane, and write wirings are perpendicularly arranged in the row and column directions so that they pass on the upper and lower sides of the MTJ elements, a memory cell array can be formed.

However, if the coercively varies between the MTJ elements, or Neel coupling between the recording layer and the fixed (pinned) layer, field leakage from the fixed layer, or a deviation between the direction of magnetization vectors of the recording layer and fixed layer (except 0° and 180°) is present, the magnetic field necessary for magnetization reversal to the "0" state and that necessary for magnetization reversal to the "1" state may be different. In this case, when data is to be written in an MTJ element which requires a large write current for magnetization reversal, and an MTJ element capable of causing magnetization reversal only by the generated magnetic filed by the write current shares the wiring, a write error occurs, resulting in a decrease in reliability as the memory.

To the contrary, in the toggle write scheme described in U.S. Pat. No. 6,545,906, since the operation margin to the write error is large, the reliability as the memory can be increased. In this toggle write scheme, the recording layer of the MTJ element is designed such that, e.g., two ferromagnetic metal layers sandwich a paramagnetic metal layer to cause anti-ferromagnetic coupling. The composite magnetic moment of the recording layer is almost zero because the magnetic moments of the two ferromagnetic metal layers cancel each other.

The toggle write scheme is described in detail in U.S. Pat. No. 6,545,906. This will briefly be described. The composite magnetic moment of the recording layer, which appears due to the current magnetic fields by the write wirings, is rotated to reverse the magnetizations of two ferromagnetic metal layers of the recording layer. The reason why this scheme is tolerant to a write error to the half-selected MTJ applied the magnetic filed generated by only one current through one wiring will briefly be described. The composite magnetic moment of the recording layer, which appears due to the current magnetic fields by the write wirings, cannot be rotated by one directional magnetic field generated by one current through one wiring. When the write is ended, and no current is supplied longer, the applied magnetic field disappears, and the former state is inevitably restored by the anti-ferromagnetic coupling of two ferromagnetic layers of the recording layer.

In the example shown in U.S. Pat. No. 6,545,906, the direction of axis of easy magnetization of the ferromagnetic layer and anti-ferromagnetic layer of the MTJ elements has an angle of ±45° or ±135° with respect to the running direction of the write wiring. A uniform magnetic field is applied to the recording layer of the MTJ element. To do this, when the direction of thickness of the recording layer is defined as the Z-axis, the field component in the Z-axis direction must be almost zero. In addition, the applied magnetic field applied to the end portion of the recording layer the that applied to the central portion must have the same direction. When these conditions are taken into consideration, the wiring width must be larger than the easy- and hard-axis lengths of the MTJ element. According to Ampere's law, the magnitude of a magnetic field generated by a current becomes larger as the path of the magnetic field vector shortens. Hence, when the wiring width is large, the generated magnetic field decreases, and the current-field conversion efficiency becomes low. The current-field conversion efficiency may be increased by forming a flux keeper layer around the wiring. In this case, since it is difficult to form the flux keeper layer on the side of the wiring facing the MTJ element, the distance from the flux keeper layer to the recording layer is long. Hence, the current-field conversion efficiency decreases compared to a general structure in which the easy-axis direction is parallel or perpendicular to the write wiring.

BRIEF SUMMARY OF THE INVENTION

According to a first aspect of the present invention, there is provided a data write method of a magnetic random access memory including a magnetoresistive element which has an axis of easy magnetization and an axis of hard magnetization, a first write wiring which runs in a direction of the axis of easy magnetization, and a second write wiring which runs in a direction of the axis of hard magnetization, comprising: a first phase of supplying a first current to the first write wiring in a first direction and supplying a second current to the second write wiring in a second direction; a second phase of stopping supplying the first current to the first write wiring and supplying the second current to the second write wiring in the second direction; and a third phase of supplying the first current to the first write wiring in a third direction reverse to the first direction and supplying the second current to the second write wiring in the second direction.

According to a second aspect of the present invention, there is provided a system including a magnetoresistive element having an axis of easy magnetization and an axis of hard magnetization; a first write wiring running in a direction of the axis of easy magnetization; and a second write wiring running in a direction of the axis of hard magnetization, wherein a first current is supplied to the first write wiring in a first direction and a second current is supplied to the second write wiring in a second-direction for a first phase, the first current is stopped to the first write wiring for a second phase, and the first current is supplied to the first write wiring in a third direction reverse to the first direction and the second current is supplied to the second write wiring in the second direction for a third phase.

BRIEF DESCRIPTION OF THE SEVERAL VIEWS OF THE DRAWING

FIG. 5A is a sectional view showing an MTJ element having a single junction structure according to the embodiment of the present invention in which the recording layer has an anti-ferromagnetic coupling structure;

FIG. 5B is a sectional view showing an MTJ element having a single junction structure according to the embodiment of the present invention in which the recording layer and fixed layer have an anti-ferromagnetic coupling structure;

FIG. 5C is a sectional view showing an MTJ element having a single junction structure according to the embodiment of the present invention in which the recording layer has an anti-ferromagnetic coupling structure, and the fixed layer has a ferromagnetic coupling structure;

FIG. 6A is a sectional view showing an MTJ element having a double junction structure according to the embodiment of the present invention in which the recording layer has an anti-ferromagnetic coupling structure;

FIG. 6B is a sectional view showing an MTJ element having a double junction structure according to the embodiment of the present invention in which the recording layer and fixed layer have an anti-ferromagnetic coupling structure;

FIG. 6C is a sectional view showing an MTJ element having a double junction structure according to the embodiment of the present invention in which the recording layer has an anti-ferromagnetic coupling structure, and the fixed layer has a ferromagnetic coupling structure;

FIGS. 8A to 8E are schematic views showing magnetization in the respective phases of Write Method Example 1 according to the embodiment of the present invention, in which FIG. 8A is a schematic view of magnetization in the initial state, FIG. 8B is a schematic view of magnetization in the first phase, FIG. 8C is a schematic view of magnetization in the second phase, FIG. 8D is a schematic view of magnetization in the third phase, and FIG. 8E is a schematic view of magnetization in the fourth phase;

FIG. 24 is a schematic block diagram showing overall Structural Example 2 of a bit line divided magnetic random access memory according to the embodiment of the present invention;

FIG. 34 is a circuit diagram showing a sense amplifier according to the embodiment of the present invention;

FIG. 35 is a circuit diagram showing a VCLMP circuit according to the embodiment of the present invention;

FIG. 36 is a circuit diagram showing a read circuit according to the embodiment of the present invention;

FIG. 37 is a circuit diagram showing a timing generation circuit according to the embodiment of the present invention;

FIG. 40 is a timing chart showing a write operation according to the embodiment of the present invention.

DETAILED DESCRIPTION OF THE INVENTION

Figure 1A:
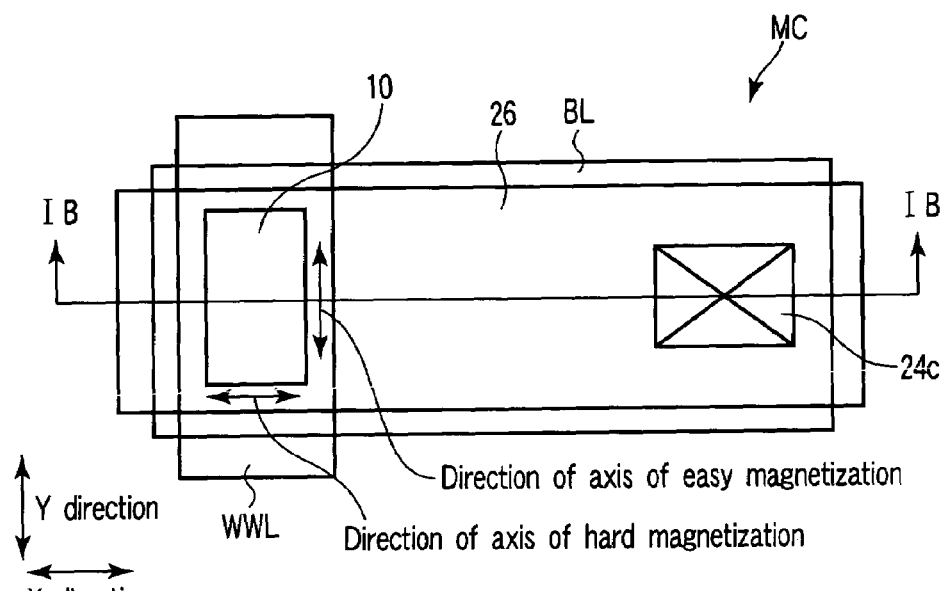
FIG. 1A is a plan view of Structural Example 1 of a memory cell of a magnetic random access memory according to an embodiment of the present invention.

The embodiment of the present invention will be described below with reference to the accompanying drawing. The same reference numerals denote the same parts throughout the drawing.

[1] Structure of Memory Cell

The structure of a memory cell of an MRAM (Magnetic Random Access Memory) according to an embodiment of the present invention will be described. Like a general write method based on the Stoner-Wohlfarth model, the memory cell according to the embodiment of the present invention has the following structure.

(1) Structural Example 1

Figure 1B:
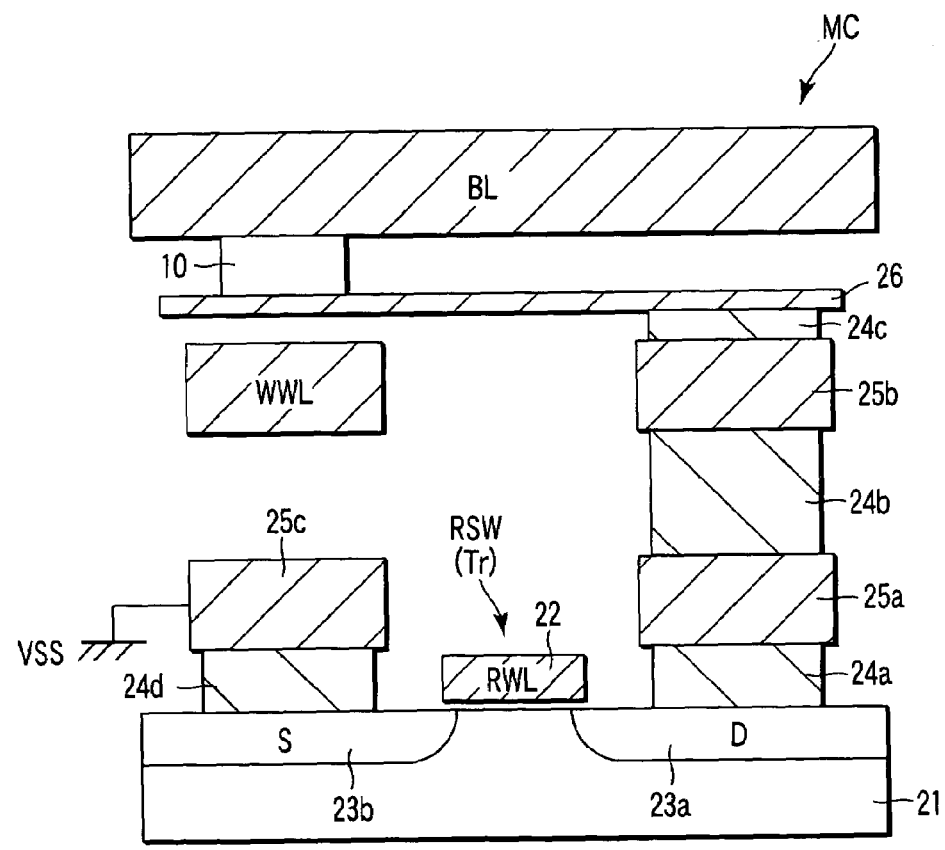
FIG. 1B is a sectional view taken along a line IB—IB in FIG. 1A.

FIGS. 1A and 1B are plan and sectional views, respectively, showing Structural Example 1 of a memory cell of a magnetic random access memory according to the embodiment of the present invention. Structural Example 1 is a so-called 1 Tr+1 MTJ structure having one MTJ (Magnetic Tunnel Junction) element and one transistor in one cell MC.

As shown in FIG. 1A, a bit line BL runs in the X direction. A write word line WWL runs in the Y direction (e.g., a direction perpendicular to the X direction) An MTJ element 10 is arranged at the intersection between the bit line BL and the write word line WWL. The MTJ element 10 is arranged while setting the direction of axis of hard magnetization in the X direction in which the bit line BL runs and the direction of axis of easy magnetization in the Y direction in which the write word line WWL runs. In other words, the write wirings (BL and WWL) are arranged respectively in directions parallel and perpendicular to the direction of axis of easy magnetization of the MTJ element 10.

As shown in FIG. 1B, one terminal of the MTJ element 10 is connected to the bit line BL. The other terminal of the MTJ element 10 is connected to one end (drain diffusion layer 23a) of the current path of a read switching element (e.g., a MOS transistor Tr) RSW through a lower metal layer 26, contacts 24a, 24b, and 24c, and interconnections 25a and 25b. The other end (source diffusion layer 23b) of the read switching element RSW is connected to, e.g., a ground terminal VSS through a contact 24d and interconnection 25c. A gate electrode 22 of the read switching element RSW is connected to a read word line RWL. The write word line WWL electrically disconnected from the MTJ element 10 is arranged under the MTJ element 10.

(2) Structural Example 2

Figure 2A:
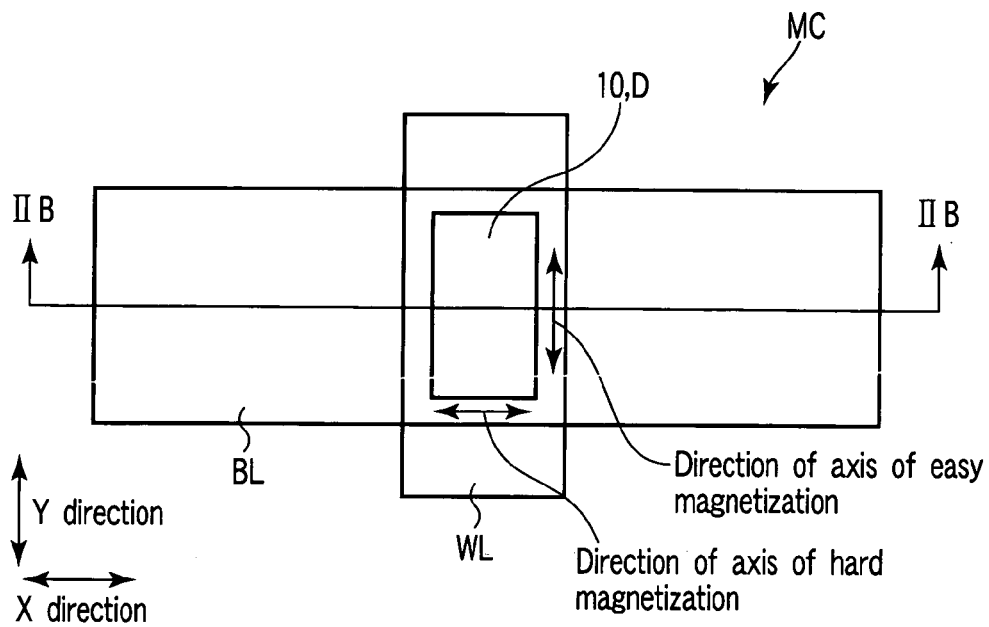
FIG. 2A is a plan view of Structural Example 2 of a memory cell of the magnetic random access memory according to the embodiment of the present invention.
Figure 2B:
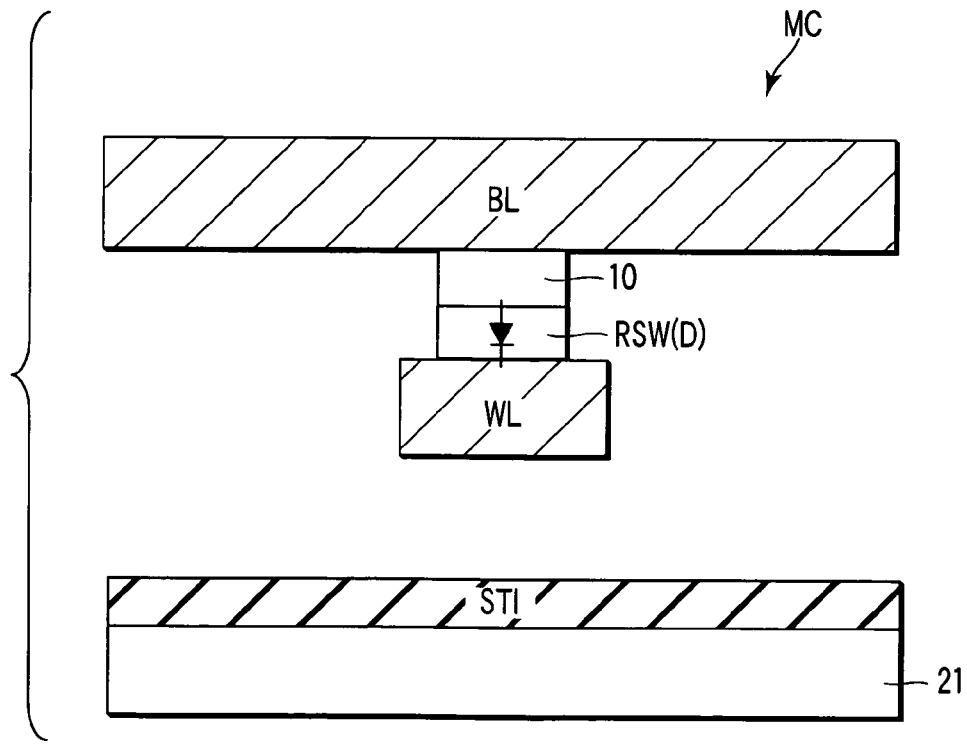
FIG. 2B is a sectional view taken along a line IIB—IIB in FIG. 2A.

FIGS. 2A and 2B are, respectively, plan and sectional views showing Structural Example 2 of a memory cell of the magnetic random access memory according to the embodiment of the present invention. Structural Example 2 is a so-called 1 Tr+1 diode structure having one MTJ element and one diode in one cell MC.

As shown in FIGS. 2A and 2B, Structural Example 2 is different from Structural Example 1 in that the read switching element RSW is a diode D. The diode D is, e.g., a p-n junction diode including a p-type semiconductor layer and n-type semiconductor layer. One terminal (e.g., the p-type semiconductor layer) of the diode D is connected to the MTJ element 10. The other terminal (e.g., the n-type semiconductor layer) of the diode D is connected to a word line WL.

In the structure shown in FIGS. 2A and 2B, a current flows from the bit line BL to the word line WL.

The location or direction of the diode D can be changed variously. For example, the diode D may be arranged in a direction to supply a current from the word line WL to the bit line BL. The diode D may be formed in a semiconductor substrate 21.

(3) Structural Example 3

Figure 3A:
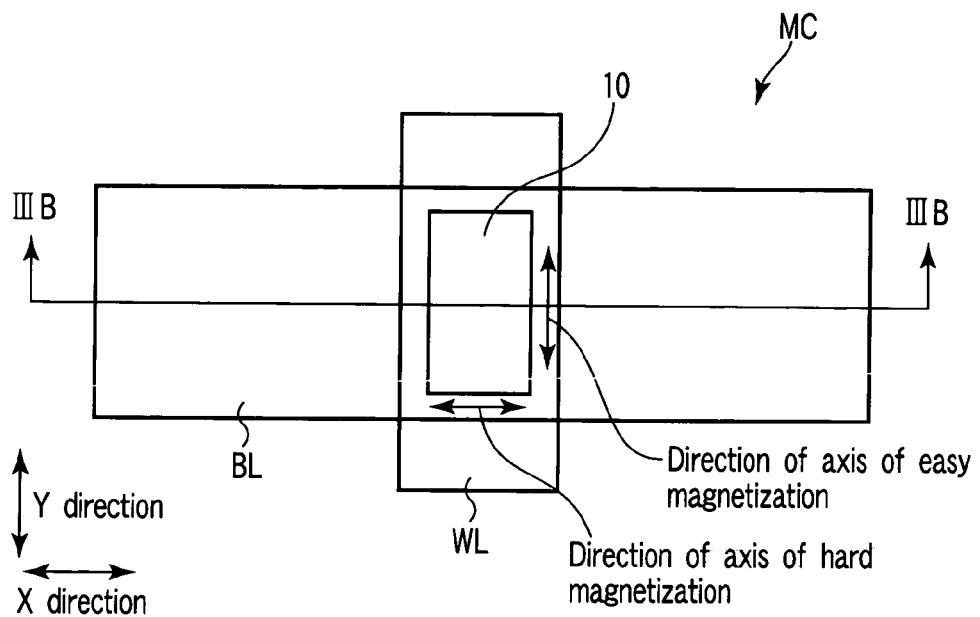
FIG. 3A is a plan view of Structural Example 3 of a memory cell of the magnetic random access memory according to the embodiment of the present invention.
Figure 3B:
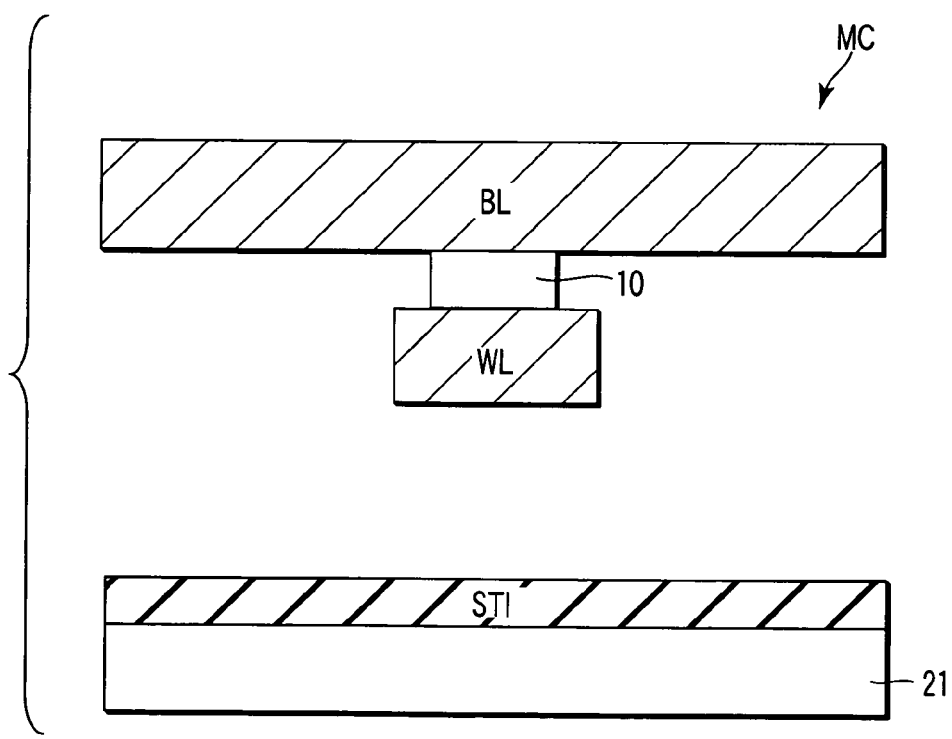
FIG. 3B is a sectional view taken along a line IIIB—IIIB in FIG. 3A.

FIGS. 3A and 3B are plan and sectional views, respectively, showing Structural Example 3 of a memory cell of the magnetic random access memory according to the embodiment of the present invention. Structural Example 3 is a so-called cross-point structure which has no read switching element in each cell MC.

As shown in FIGS. 3A and 3B, Structural Example 3 is different from Structural Example 1 in that no read switching element RSW is arranged in each cell. Hence, one terminal of the MTJ element 10 is connected to the bit line BL. The other terminal of the MTJ element 10 is connected to the word line WL.

(4) Structural Example 4

Figure 4A:
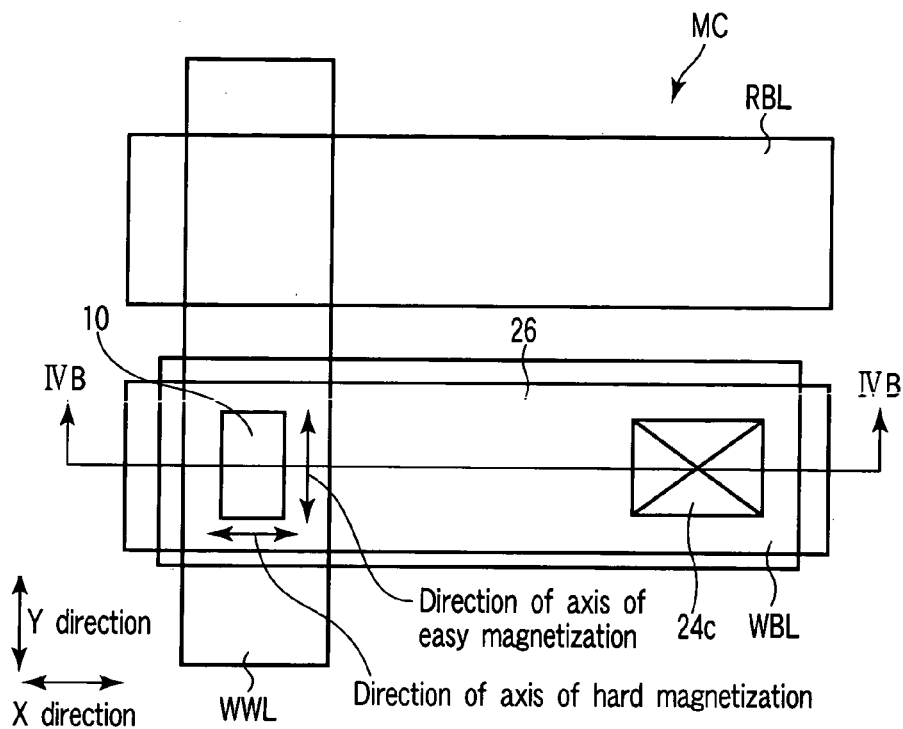
FIG. 4A is a plan view of Structural Example 4 of a memory cell of the magnetic random access memory according to the embodiment of the present invention.
Figure 4B:
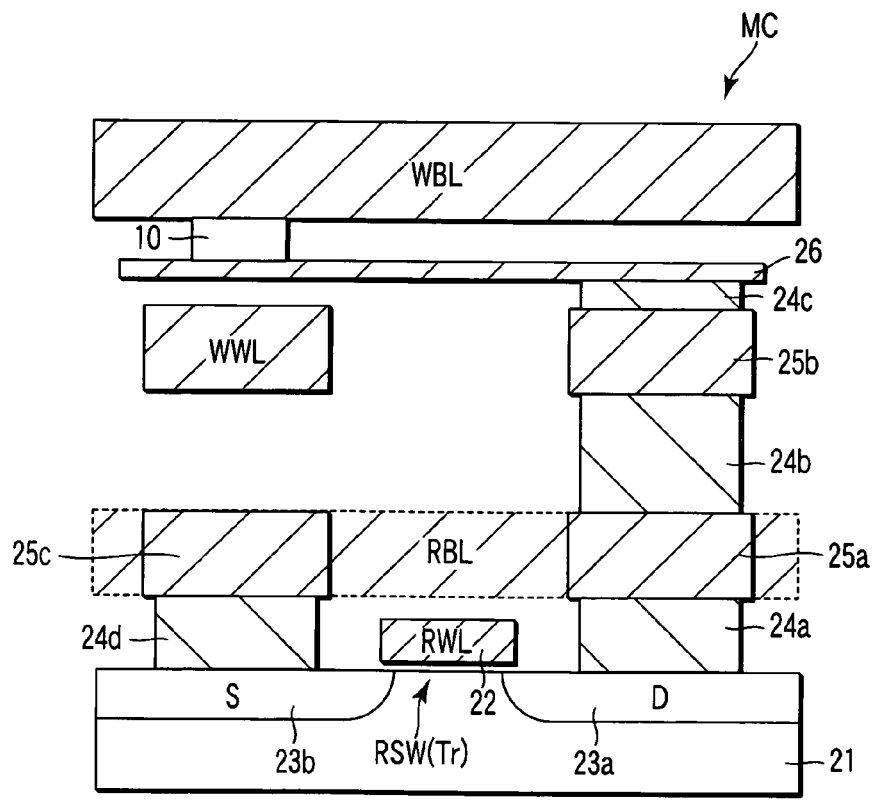
FIG. 4B is a sectional view taken along a line IVB—IVB in FIG. 4A.

FIGS. 4A and 4B are, respectively, plan and sectional views showing Structural Example 4 of a memory cell of the magnetic random access memory according to the embodiment of the present invention. Structural Example 4 is a so-called bit line divided structure in which the bit line is divided into a write wiring and a read wiring.

As shown in FIGS. 4A and 4B, Structural Example 4 is different from Structural Example 1 in that the bit line is divided into a write bit line WBL and a read bit line RBL. The write bit line WBL runs in the X direction and is connected to one terminal of the MTJ element 10. The read bit line RBL runs in the X direction and is connected to one terminal (source diffusion layer 23b) of the read switching element RSW through the contact 24d and interconnection 25c.

[2] Structure of MTJ Element

The structure of the MTJ element according to the embodiment of the present invention will be described.

FIGS. 5A to 5C are sectional views of MTJ elements having a single junction structure according to the embodiment of the present invention.

As shown in FIGS. 5A to 5C, the MTJ element 10 has a single junction structure including a fixed layer (pinned layer) 11 having a fixed magnetization direction, a recording layer (free layer) 13 having a changeable magnetization direction, a nonmagnetic layer (tunnel barrier layer) 12 sandwiched between the fixed layer 11 and the recording layer 13, and an anti-ferromagnetic layer 14 to fix the magnetization direction of the fixed layer 11. At least the recording layer 13 has an anti-ferromagnetic coupling structure.

In the MTJ element 10 shown in FIG. 5A, only the recording layer 13 has an anti-ferromagnetic coupling structure. More specifically, the recording layer 13 has a three-layered structure including a ferromagnetic layer 13-f1, nonmagnetic layer 13-n, and ferromagnetic layer 13-f2. They are magnetically coupled (interlayer exchange coupling) such that the magnetization directions of the ferromagnetic layers 13-f1 and 13-f2 are set in the anti-parallel state.

In the MTJ element 10 shown in FIG. 5B, both the recording layer 13 and the fixed layer 11 have an anti-ferromagnetic coupling structure. More specifically, the recording layer 13 has a three-layered structure including the ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the anti-parallel state. The fixed layer 11 has a three-layered structure including a ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the anti-parallel state.

In the MTJ element 10 shown in FIG. 5C, the recording layer 13 has an anti-ferromagnetic coupling structure, and the fixed layer 11 has a ferromagnetic coupling structure. More specifically, the recording layer 13 has a three-layered structure including the ferromagnetic layer 13-f1, nonmagnetic layer 13-n, and ferromagnetic layer 13-f2. They are magnetically coupled such that the magnetization directions of the ferromagnetic layers 13-f1 and 13-f2 are set in the anti-parallel state. The fixed layer 11 has a three-layered structure including the ferromagnetic layer 11-f1, nonmagnetic layer 11-n, and ferromagnetic layer 11-f2. They are magnetically coupled such that the magnetization directions of the ferromagnetic layers 11-f1 and 11-f2 are set in the parallel state.

FIGS. 6A to 6C are sectional views of MTJ elements having a double junction structure according to the embodiment of the present invention.

As shown in FIGS. 6A to 6C, the MTJ element 10 may have a double junction structure. More specifically, the MTJ element 10 has two nonmagnetic layers 12a and 12b which function as tunnel barrier layers. A first fixed layer 11a is connected to one terminal of the recording layer 13 through the first nonmagnetic layer 12a. A second fixed layer 11b is connected to the other terminal of the recording layer 13 through the second nonmagnetic layer 12b.

The double junction structure can also be formed such that the recording layer 13 has an anti-ferromagnetic coupling structure, and the fixed layers 11a and 11b have a single-layer structure (FIG. 6A), both the recording layer 13 and the fixed layers 11a and 11b have an anti-ferromagnetic coupling structure (FIG. 6B), or the recording layer 13 has an anti-ferromagnetic coupling structure, and the fixed layers 11a and 11b have a ferromagnetic coupling structure (FIG. 6C), like the single junction structure.

When the recording layer 13 has an anti-ferromagnetic coupling structure, as described above, the magnetic moment is zero, unlike the single-layer structure. Hence, the holding tolerance to external magnetic disturbance can be increased. In addition, the toggle write scheme (to be described later) can be implemented. Hence, the reliability of the memory can be increased.

In the single junction structure, the manufacturing process of the MTJ element 10 can be simplified as compared to the double junction structure. In addition, the size of the MTJ element 10 in the deposition direction can be made small. On the other hand, in the double junction structure, the bias voltage per tunnel junction is half that in the single junction structure. For this reason, the decrease in MR (MagnetoResistive) ratio according to an increased in bias voltage can be suppressed.

The fixed layer 11 and recording layer 13 need not always have a three-layered structure including a ferromagnetic layer, nonmagnetic layer, and ferromagnetic layer. The number of layers may be increased. In addition, the fixed layer 11 and recording layer 13 may have a layered structure including a plurality of ferromagnetic materials.

The planar shape of the MTJ element 10 need not always be rectangular. It can be changed to, e.g., an elliptic, rhombic, parallelogram, circle, or cross shape.

In the MTJ element 10, all the anti-ferromagnetic layer 14, fixed layer 11, nonmagnetic layer 12, and recording Layer 13 need not always have planar shapes of the same size. For example, all the side surfaces of the anti-ferromagnetic layer 14, fixed layer 11, nonmagnetic layer 12, and recording layer 13 may continuously be flush with each other while decreasing the size of the planar shape toward the top. That is, the structure may have a trapezoidal section. Alternatively, the side surface of the MTJ element 10 may partially be discontinuous, and the anti-ferromagnetic layer 14, fixed layer 11, and nonmagnetic layer 12 may have a larger planar shape than the recording layer 13.

[3] Write/Read Method

The write/read method of the magnetic random access memory according to the embodiment of the present invention will be described.

(1) Write Method

The write method according to the embodiment of the present invention employs the toggle write scheme. When the write operation is performed by the toggle scheme, the state of the data of a selected cell changes sequentially "1"→"0"→"1"→"0". In other words, the relative magnetization direction of the storage layer (the ferromagnetic layer on the side of the fixed layer) and fixed layer (the ferromagnetic layer on the side of the storage layer when the fixed layer is made of a plurality of ferromagnetic layers divided by nonmagnetic layers) of the MTJ element 10 changes from the parallel state to the anti-parallel state or from the anti-parallel state to the parallel state.

Hence, data written in the selected cell must be read out before arbitrary data is written. If the arbitrary data has already been written, no write is executed. If data different from the arbitrary data has been written, the write is executed to rewrite the data. For example, assume that "0" data is to be written in the selected cell. When the data read out from the selected cell is "0" data, no write is executed. Only when the data is "1" data, the write is executed. Similarly, assume that "1" data is to be written in the selected cell. When the data read out from the selected cell is "1" data, no write is executed. Only when the data is "0" data, the write is executed.

Examples of the write method when it is determined by the confirmation phase that the write operation is necessary, i.e., when the data of the selected cell must be rewritten will be described below in detail.

(1-1) Write Method Example 1

Figure 7:
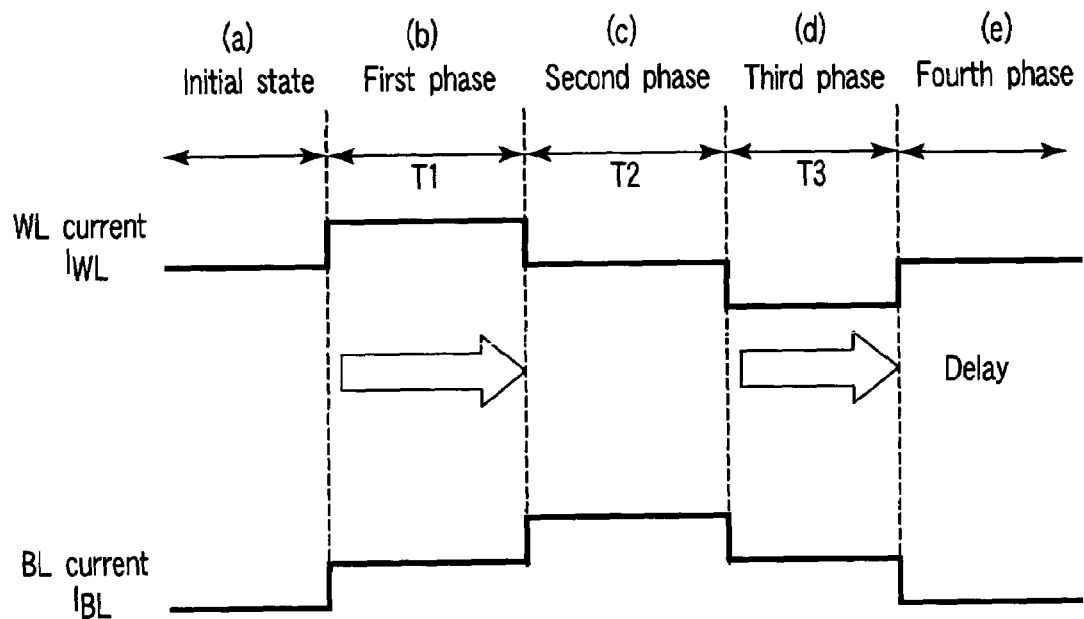
FIG. 7 is a graph showing the waveforms of write currents of Write Method Example 1 according to the embodiment of the present invention.
Figure 9:
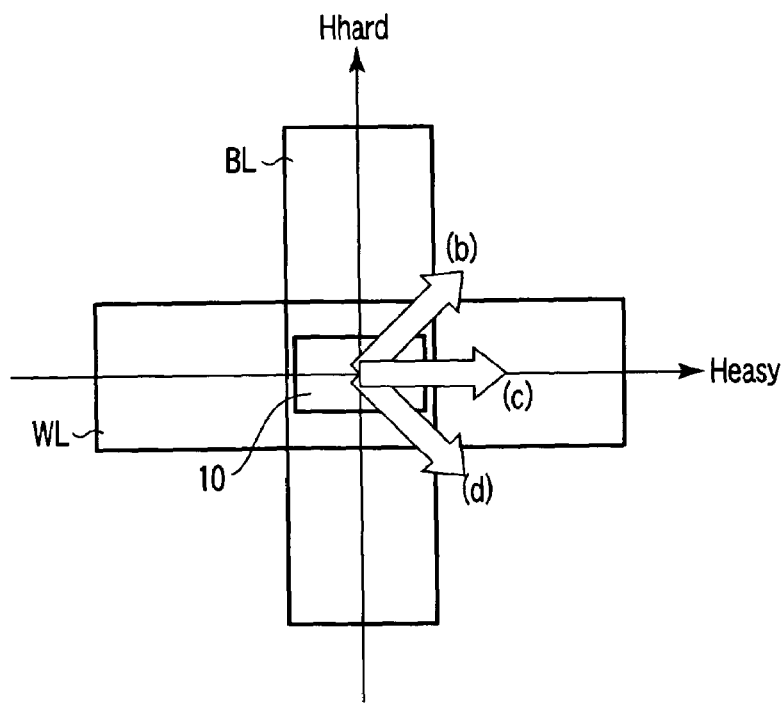
FIG. 9 is a schematic view showing the magnetization reversal process by the applied field of Write Method Example 1 according to the embodiment of the present invention and the magnitude of the applied field.

FIG. 7 is a graph showing the waveforms of write currents of Write Method Example 1 according to the embodiment of the present invention. FIGS. 8A to 8E are schematic views showing magnetization in the respective phases of Write Method Example 1 according to the embodiment of the present invention. FIG. 9 is a schematic view showing the magnetization reversal process by the applied field of Write Method Example 1 according to the embodiment of the present invention and the magnitude of the applied field.

(Initial State)

In the initial state, as shown in FIG. 7A, both the bit line BL and the word line WL are off. Since no write currents $I_{BL}$ and $I_{WL}$ flow to them, a nonenergized state is set.

Figure 8A:
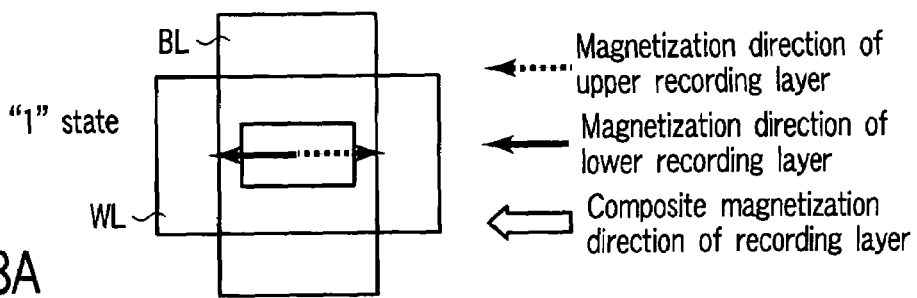

In the initial state, assume that the recording layer 13 of the MTJ element 10 has the magnetization direction shown in FIG. 8A. More specifically, assume that the magnetization of the upper recording layer (e.g., the layer 13-f2 shown in FIG. 5A) and the magnetization of the lower recording layer (e.g., the layer 13-f1 shown in FIG. 5A) are anti-ferromagnetically coupled, and the magnetization of the upper recording layer is directed rightward (0° direction), and that of the lower recording layer is directed leftward (180° direction). The magnetizations of the upper and lower recording layers are directed in 180° opposite directions. Their magnetizations (magnetic moments) balance. For these reasons, the composite magnetization (composite magnetic moment) in the recording layer 13 is almost zero in the initial state.

Note that the initial state is defined as a state in which, e.g., "1" data is written.

(First Phase)

In the first phase, as shown in FIG. 7B, both the bit line BL and the word line WL are turned on, and the write currents $I_{BL}$ and $I_{WL}$ are supplied to them.

Figure 8B:
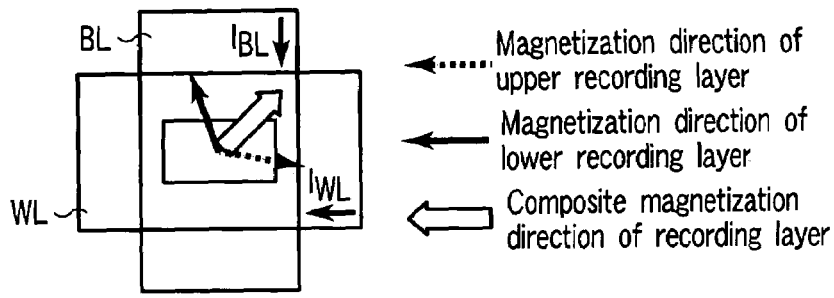

In the first phase, as shown in FIG. 8B, the composite magnetization (composite magnetic moment) of the recording layer 13 of the MTJ element 10 appears due to the composite field generated by the write currents $I_{BL}$ and $I_{WL}$. The composite magnetization rotates clockwise to the generated magnetic field while the upper and lower recording layers maintain the anti-ferromagnetic coupling state. That is, in the first phase, the magnetic field is applied in the 45° direction with respect to the direction of axis of easy magnetization of the MTJ element 10 ((b) in FIG. 9). As a result, the composite magnetization of the recording layer 13 rotates clockwise to nearly the 45° direction.

The bit line BL is arranged above the MTJ element 10. The word line WL is arranged under the MTJ element 10. Hence, in the first phase, the write current $I_{BL}$ is directed to the down side on the drawing surface, and the write current $I_{WL}$ is directed to the left side on the drawing surface, as shown in FIG. 8B.

(Second Phase)

In the second phase, as shown in FIG. 7C, the word line WL is turned off to stop supplying the write current $I_{WL}$, and the write current $I_{BL}$ is supplied to only the bit line BL. The write current $I_{BL}$ in the second phase is supplied in the same direction as that of the write current $I_{BL}$ in the first phase.

Figure 8C:
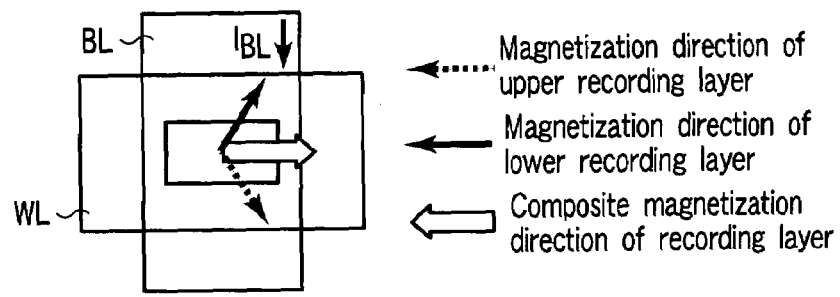

In the second phase, as shown in FIG. 8C, the composite magnetization (composite magnetic moment) of the recording layer 13 of the MTJ element 10 further rotates clockwise while the upper and lower recording layers maintain the anti-ferromagnetic coupling state. That is, in the second phase, the magnetic field is applied in the 0° direction with respect to the direction of axis of easy magnetization of the MTJ element 10 ((c) in FIG. 9). As a result, the composite magnetization of the recording layer 13 rotates clockwise to nearly the 0° direction.

(Third Phase)

In the third phase, as shown in FIG. 7D, both the bit line BL and the word line WL are turned on to supply the write currents $I_{BL}$ and $I_{WL}$ to them. The write current $I_{BL}$ in the third phase is supplied in the same direction as that of the write current $I_{BL}$ in the first phase. However, the write current $I_{WL}$ in the third phase is supplied in the direction opposite to that of the write current $I_{WL}$ in the first phase.

Figure 8D:
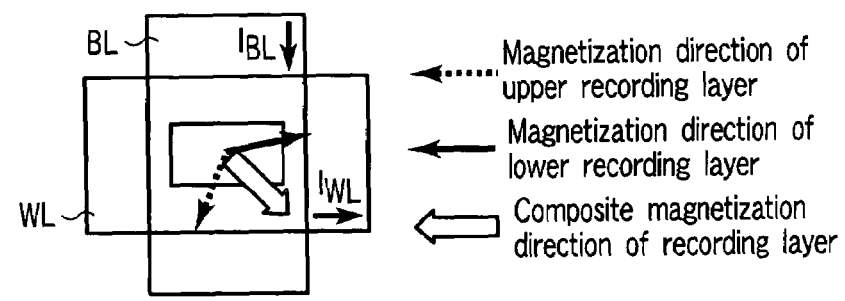
Figure 8E:
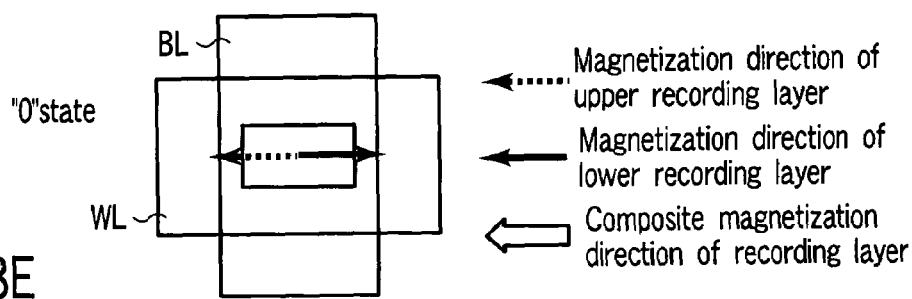

In the third phase, as shown in FIG. 8D, the composite magnetization (composite magnetic moment) of the recording layer 13 of the MTJ element 10 further rotates clockwise while the upper and lower recording layers maintain the anti-ferromagnetic coupling state. That is, in the third phase, the magnetic field is applied in the −45° direction with respect to the direction of axis of easy magnetization of the MTJ element 10((*d*) in FIG. 9). As a result, the composite magnetization of the recording layer 13 rotates clockwise to nearly the −45° direction.

(Fourth Phase)

In the fourth phase, as shown in FIG. 7E, both the bit line BL and the word line WL are turned off to stop supplying the write currents $I_{BL}$ and $I_{WL}$ to them.

Since the applied field disappears in the fourth phase, the magnetizations of the upper and lower recording layers of the MTJ element 10 to the stable states in the 0° and 180° directions (direction of axis of easy magnetization). As a result, the magnetization of the upper recording layer is directed leftward (180° direction), and that of the lower recording layer is directed rightward (0° direction) The magnetizations of the upper and lower recording layers are directed in 180° opposite directions. Their magnetizations (magnetic moments) balance. For these reasons, the composite magnetization (composite magnetic moment) in the recording layer 13 is almost zero.

In the above-described way, the magnetizations of the upper and lower recording layers can be rotated by 180° from the initial state. As a result, the data of the MTJ element 10 can be rewritten from "1" to "0".

The magnitude of the write current $I_{BL}$ supplied to the bit line BL in the second phase is preferably larger than in the first and third phases (e.g., doubled). The magnitude of the magnetic field applied to the MTJ element 10 in the first phase almost equals that in the third phase (FIG. 9).

According to Write Method Example 1, the write currents $I_{BL}$ and $I_{WL}$ are supplied to the bit line BL and word line WL first. Next, the write current $I_{BL}$ is supplied to only the bit line BL. Finally, the write currents $I_{BL}$ and $I_{WL}$ are supplied to the bit line BL and word line WL. In the last phase, the write current $I_{WL}$ is supplied to the word line WL in the direction opposite to that in the initial state. This write method can be implemented by setting the direction of axis of easy magnetization of the MTJ element 10 parallel to the running direction of the word line WL and the direction of axis of hard magnetization of the MTJ element 10 parallel to the running direction of the bit line BL. Accordingly, the following effects can be obtained.

Figure 10A:
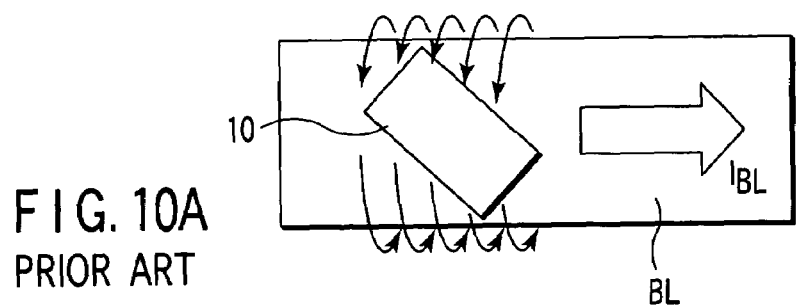
FIG. 10A is a view showing the lines of magnetic force of a current magnetic field according to a prior art.
Figure 10B:
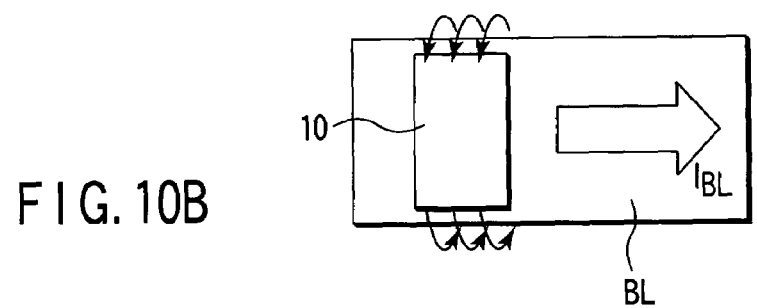
FIG. 10B is a view showing the lines of magnetic force of a current magnetic field by the write method according to the embodiment of the present invention.

In the toggle write scheme of the prior art (e.g., U.S. Pat. No. 6,545,906), as shown in FIG. 10A, the MTJ element 10 must be arranged obliquely with respect to the write wiring. For this reason, the path of the lines of magnetic force generated from, e.g., the bit line current to the MTJ element 10 is long. In the embodiment of the present invention, however, as shown in FIG. 10B, the MTJ element 10 is arranged parallel or perpendicularly to the write wiring. For this reason, the path of the lines of magnetic force generated from, e.g., the bit line current to the MTJ element 10 is short. When the two schemes are compared under the same current, the generated magnetic field can be made larger in the embodiment of the present invention than that in the prior art. Hence, the current-field conversion efficiency can be increased.

Figure 11A:
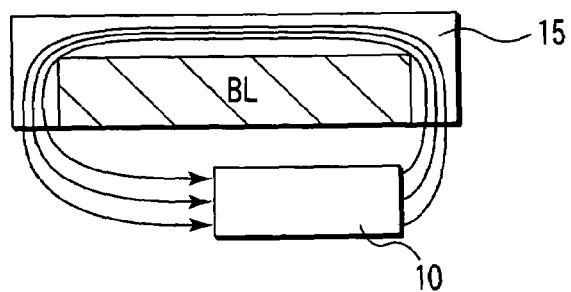
FIG. 11A is a view showing the lines of magnetic force of a current magnetic field according to the prior art when a flux keeper layer is formed.
Figure 11B:
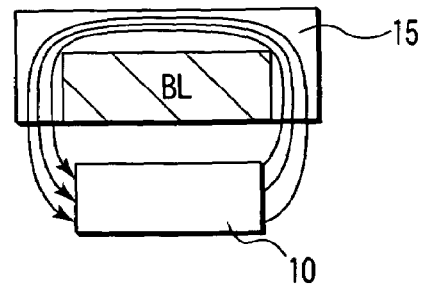
FIG. 11B is a view showing the lines of magnetic force of a current magnetic field according to the prior art when a flux keeper layer is formed.

Assume that the current-field conversion efficiency is increased by adding a flux keeper layer 15 around the wiring. In the toggle write scheme of the prior art (e.g., U.S. Pat. No. 6,545,906), as shown in FIG. 11A, the MTJ element 10 must be arranged obliquely with respect to the write wiring. For this reason, the flux keeper layer 15 and the recording layer of the MTJ element 10 cannot be placed close. In the embodiment of the present invention, however, as shown in FIG. 11B, the MTJ element 10 is arranged parallel or perpendicularly to the write wiring. For this reason, the flux keeper layer 15 and the recording layer of the MTJ element 10 can be placed close. If the supplied current is same, the magnetic field which passes through the recording layer of the MTJ element 10 is larger than that in the prior art. Since the current-field conversion efficiency can be increased, the write can be done by a smaller current.

Figure 12:
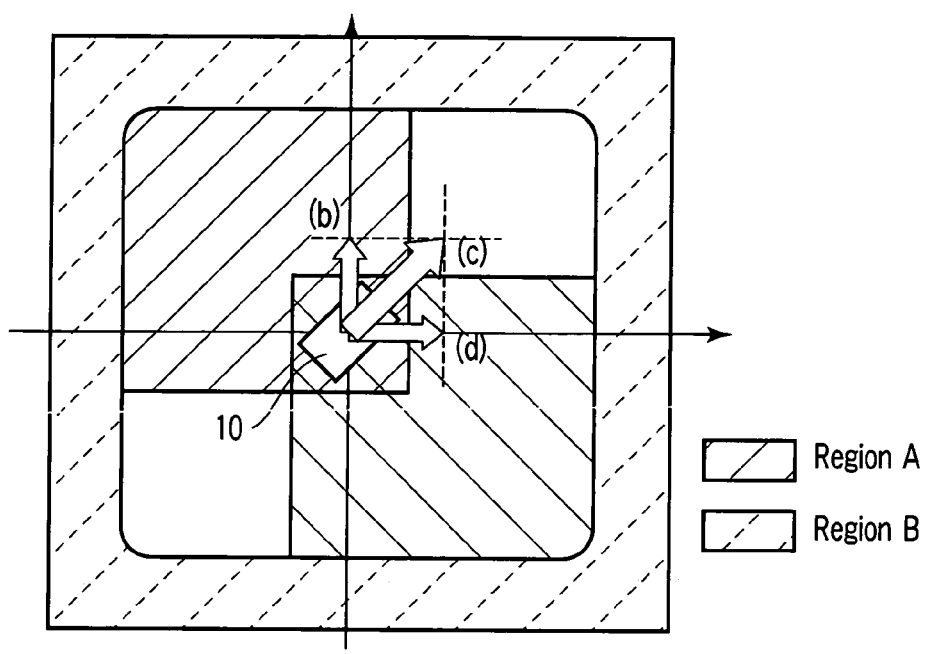
FIG. 12 is an asteroid diagram showing the threshold value to cause magnetization reversal by the toggle scheme of prior art.
Figure 13:
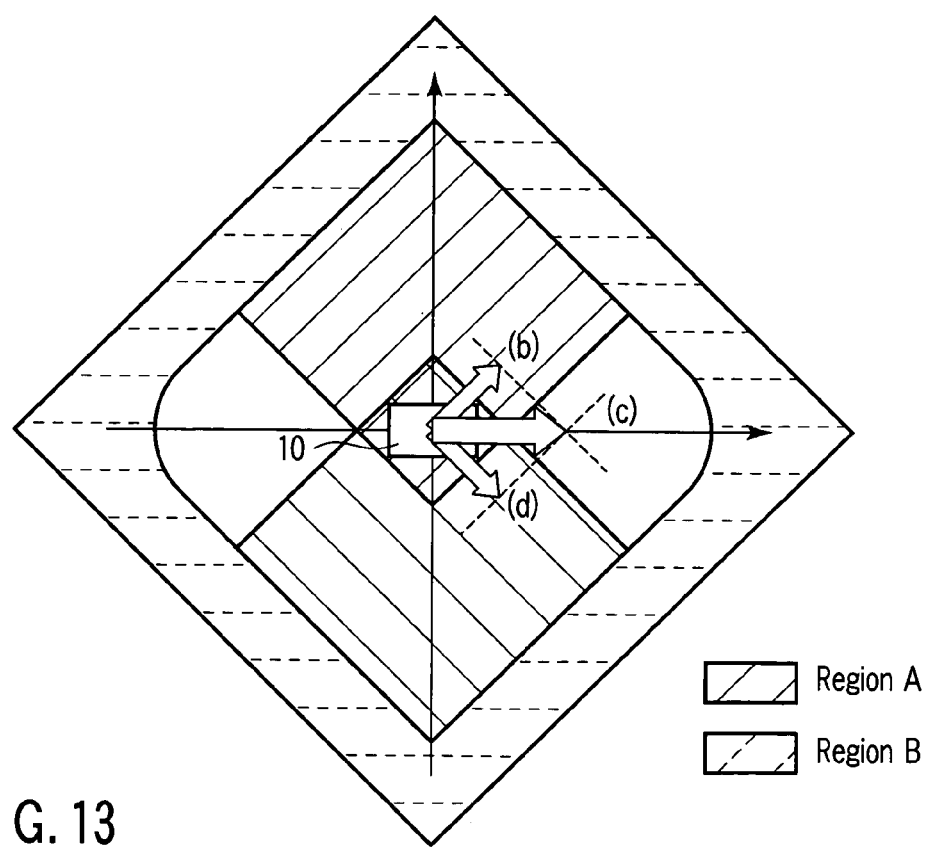
FIG. 13 is an asteroid diagram showing the threshold value to cause magnetization reversal by the toggle scheme of Write Method Example 1 according to the embodiment of the present invention.

In the prior art, as shown in FIG. 12, magnetization reversal can occur in the first and third quadrants in which the easy-axis direction of the MTJ element 10 is directed. However, no write is executed in the second and fourth quadrants indicated by regions A. Magnetization reversal occurs at a probability of 50% in a region B where a large magnetic field to break anti-ferromagnetic coupling is applied. In the embodiment of the present invention, as shown in FIG. 13, in a state (c) in the second phase, a current magnetic field by only the bit line BL is applied. Even in the half-selected state in which only the bit line BL is selected, a magnetic field is applied in the direction (c). For this reason, the tolerance to the half-selected state appears to be low. However, when the composite magnetic moment by the two ferromagnetic layers of the recording layer 13 is almost zero, i.e., one of the magnetic moments of the two ferromagnetic layers of the recording layer 13 is directed in the direction of the field by the bit line BL, and the other is directed in the reverse direction, no magnetization reversal occurs unless a magnetic field to break the anti-ferromagnetic coupling between them is applied. Hence, a write error in a half-selected cell can be reduced.

An important point of the toggle write scheme is to generate a composite magnetic moment directed in the direction of applied field from the state in which the composite magnetic moment is zero because of anti-ferromagnetic coupling. This magnetic field is generated by the composite field of the two write wirings in the first phase. For this reason, the current driving capability of the write driver/sinker can be made smaller than in the conventional toggle scheme so that the chip size can be reduced.

(1-2) Write Method Example 2

Figure 14:
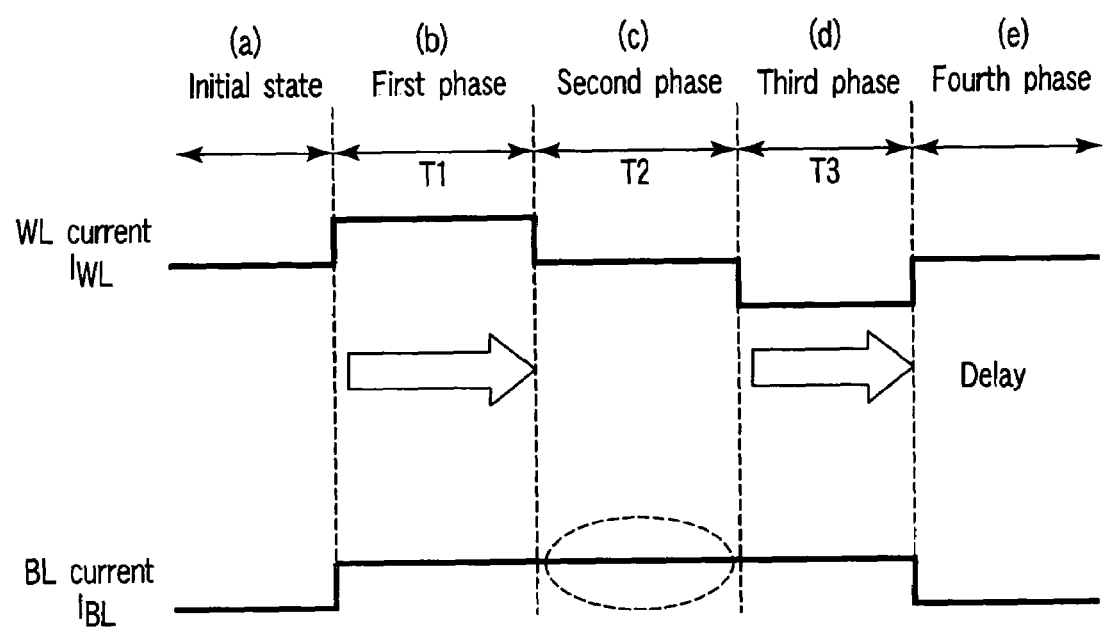
FIG. 14 is a graph showing the waveforms of write currents of Write Method Example 2 according to the embodiment of the present invention.
Figure 15:
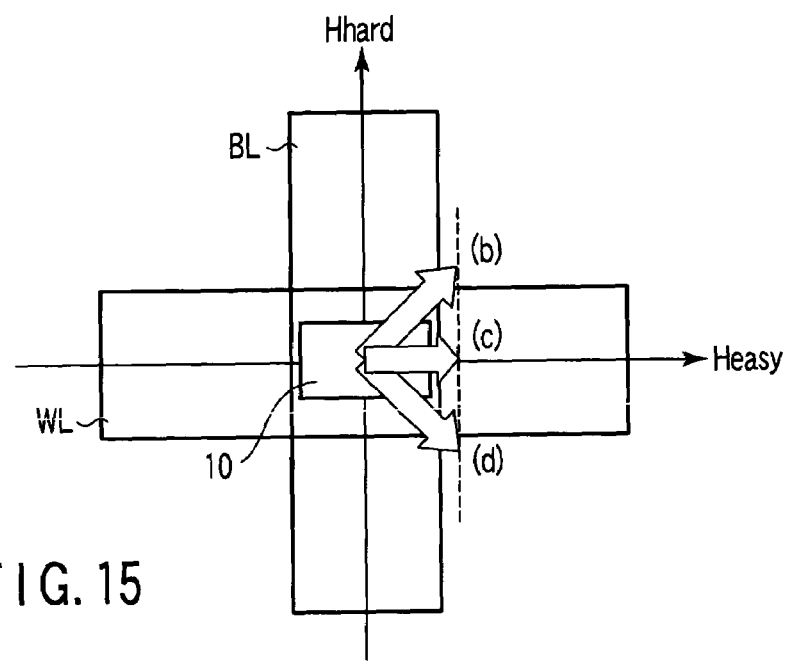
FIG. 15 is a schematic view showing the magnetization reversal process by the applied field of Write Method Example 2 according to the embodiment of the present invention and the magnitude of the applied field.
Figure 16:
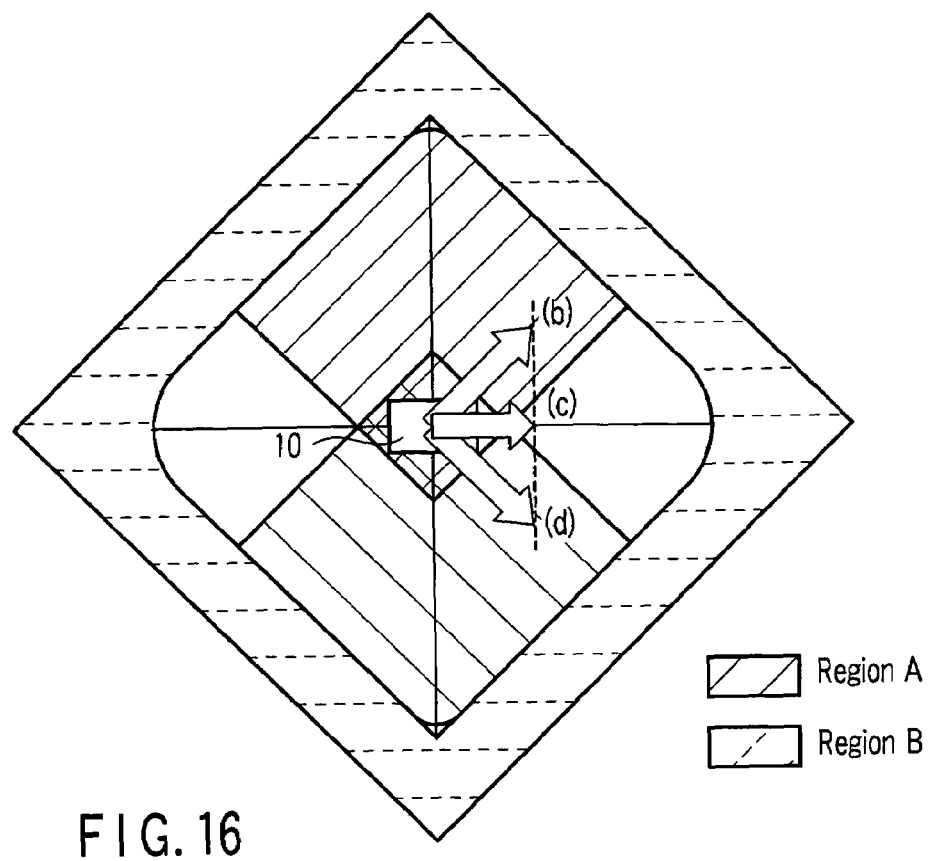
FIG. 16 is an asteroid diagram showing the threshold value to cause magnetization reversal by the toggle scheme of Write Method Example 2 according to the embodiment of the present invention.

FIG. 14 is a graph showing the waveforms of write currents of Write Method Example 2 according to the embodiment of the present invention. FIG. 15 is a schematic view showing the magnetization reversal process by the applied field of Write Method Example 2 according to the embodiment of the present invention and the magnitude of the applied field. FIG. 16 is an asteroid diagram showing the threshold value to cause magnetization reversal by the toggle scheme of Write Method Example 2 according to the embodiment of the present invention.

As shown in FIG. 14, Write Method Example 2 is different from Write Method Example 1 in that the magnitude of the write current $I_{BL}$ supplied to the bit line BL in the second phase is the same as that in the first and third phases. Hence, the magnitude of the write current $I_{BL}$ supplied to the bit line BL does not change during the first to third phases.

In this case, as shown in FIGS. 15 and 16, the magnitude of the magnetic field applied to the MTJ element 10 in the second phase is smaller than that in the first and third phases.

According to Write Method Example 2, the same effect as in Write Method Example 1 can be obtained. In addition, since the write current $I_{BL}$ having a predetermined magnitude is supplied to the bit line BL in the first to third phases, the current driving circuit can easily be controlled.

(1-3) Write Method Example 3

Figure 17:
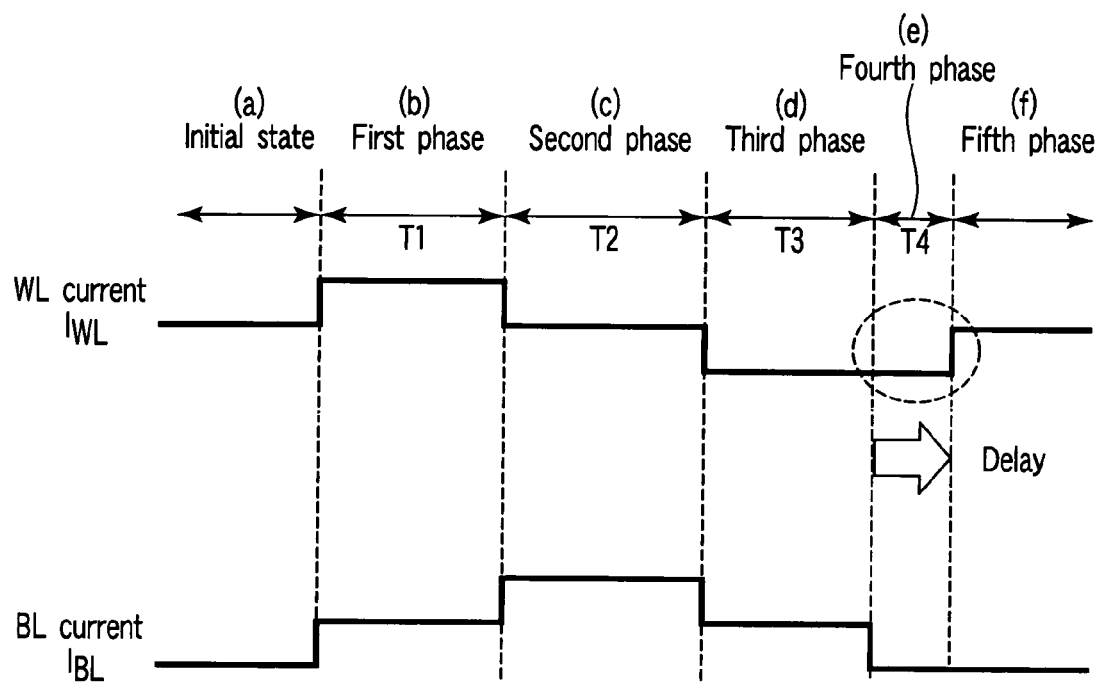
FIG. 17 is a graph showing the waveforms of write currents of Write Method Example 3 according to the embodiment of the present invention.
Figure 18:
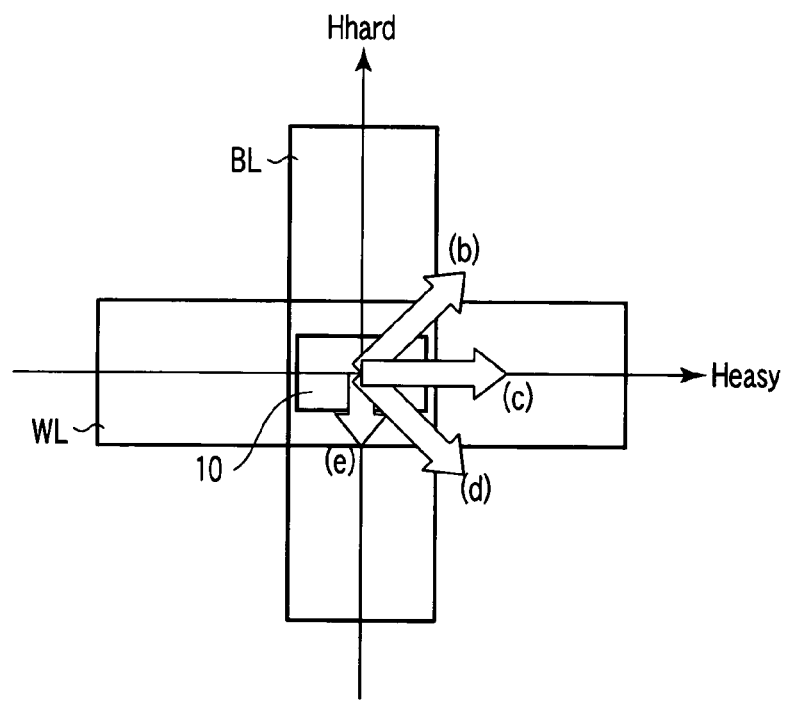
FIG. 18 is a schematic view showing the magnetization reversal process by the applied field of Write Method Example 3 according to the embodiment of the present invention and the magnitude of the applied field.

FIG. 17 is a graph showing the waveforms of write currents of Write Method Example 3 according to the embodiment of the present invention. FIG. 18 is a schematic view showing the magnetization reversal process by the applied field of Write Method Example 3 according to the embodiment of the present invention and the magnitude of the applied field.

As shown in FIG. 17, Write Method Example 3 includes five phases by adding one phase after the third phase of Write Method Example 1.

More specifically, the write current $I_{WL}$ of the word line WL is continuously supplied for a while even after the third phase. Supply of the write current $I_{BL}$ of the bit line BL is stopped after the third phase. In other words, after the third phase, the write current flowing in the direction of axis of easy magnetization of the MTJ element is stopped after it is continuously supplied longer than the write current flowing in the direction of axis of hard magnetization. Accordingly, as shown in FIG. 18, a magnetic field is generated in the −90° direction in the fourth phase. Since the rotation of the composite magnetization (composite magnetic moment) of the recording layer 13 of the MTJ element 10 can further be continued, stable magnetization reversal can be implemented.

A time T4 to continuously supply the write current $I_{WL}$ in the fourth phase is preferably shorter than any of times T1, T2, and T3 of the remaining phases.

According to Write Method Example 3, the same effect as in Write Method Example 1 can be obtained. In addition, when the write current is continuously supplied to the word line WL for a while even after the third-phase, stable magnetization reversal can be implemented.

(1-4) Write Method Example 4

Figure 19:
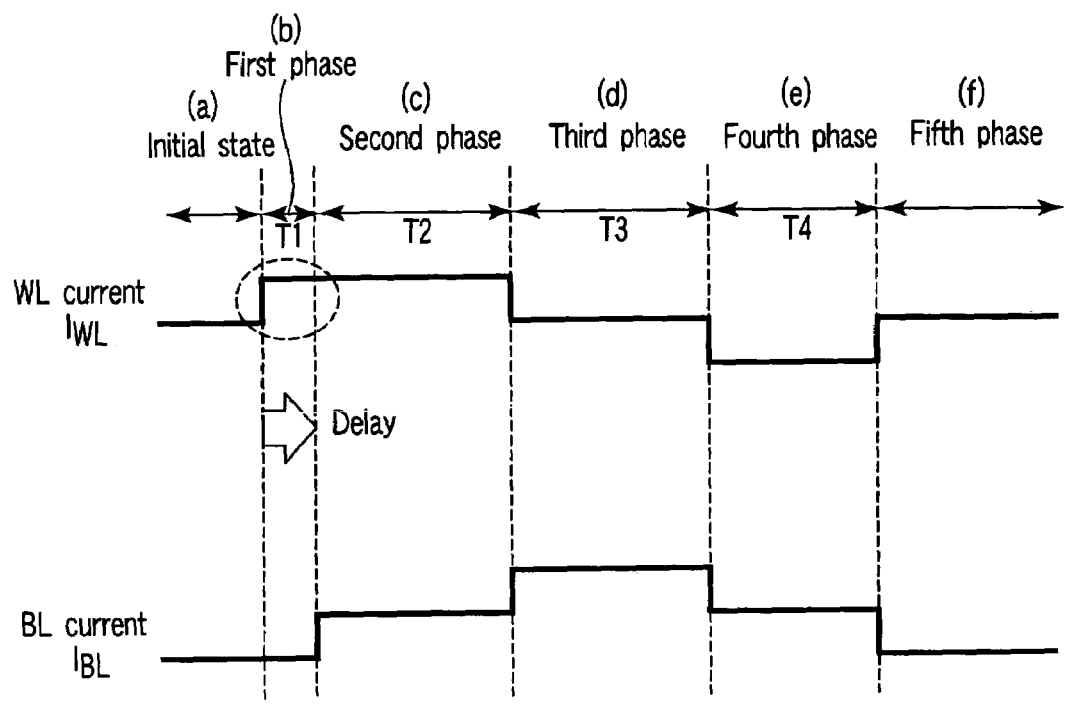
FIG. 19 is a graph showing the waveforms of write currents of Write Method Example 4 according to the embodiment of the present invention.
Figure 20:
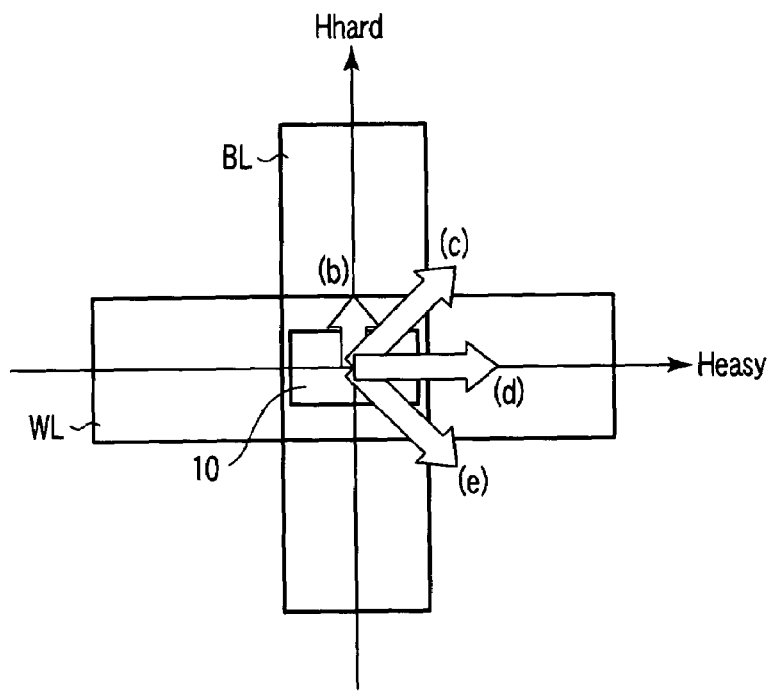
FIG. 20 is a schematic view showing the magnetization reversal process by the applied field of Write Method Example 4 according to the embodiment of the present invention and the magnitude of the applied field.

FIG. 19 is a graph showing the waveforms of write currents of Write Method Example 4 according to the embodiment of the present invention. FIG. 20 is a schematic view showing the magnetization reversal phase by the applied field of Write Method Example 4 according to the embodiment of the present invention and the magnitude of the applied field.

As shown in FIG. 19, Write Method Example 4 includes five phases by adding one phase before the first phase of Write Method Example 1.

More specifically, the write current $I_{WL}$ of the word line WL is first supplied after the initial state is confirmed. The write current $I_{BL}$ of the bit line BL is not supplied yet even after the initial state is confirmed. In other words, after the initial state is confirmed, the write current flowing in the direction of axis of easy magnetization of the MTJ element is supplied earlier than the write current flowing in the direction of axis of hard magnetization. Accordingly, as shown in FIG. 20, a magnetic field is generated in the 90° direction in the first phase.

The time T1 to supply the write current $I_{WL}$ in the first phase is preferably shorter than any of times T2, T3, and T4 of the remaining phases.

According to Write Method Example 4, the supply timing of the write current $I_{WL}$ of the word line WL and that of the write current $I_{BL}$ of the bit line BL are shifted. Hence, as the write phase progresses, the generated field can reliably be rotated in a predetermined direction, and stable magnetization reversal can be implemented.

(1-5) Write Method Example 5

Figure 21:
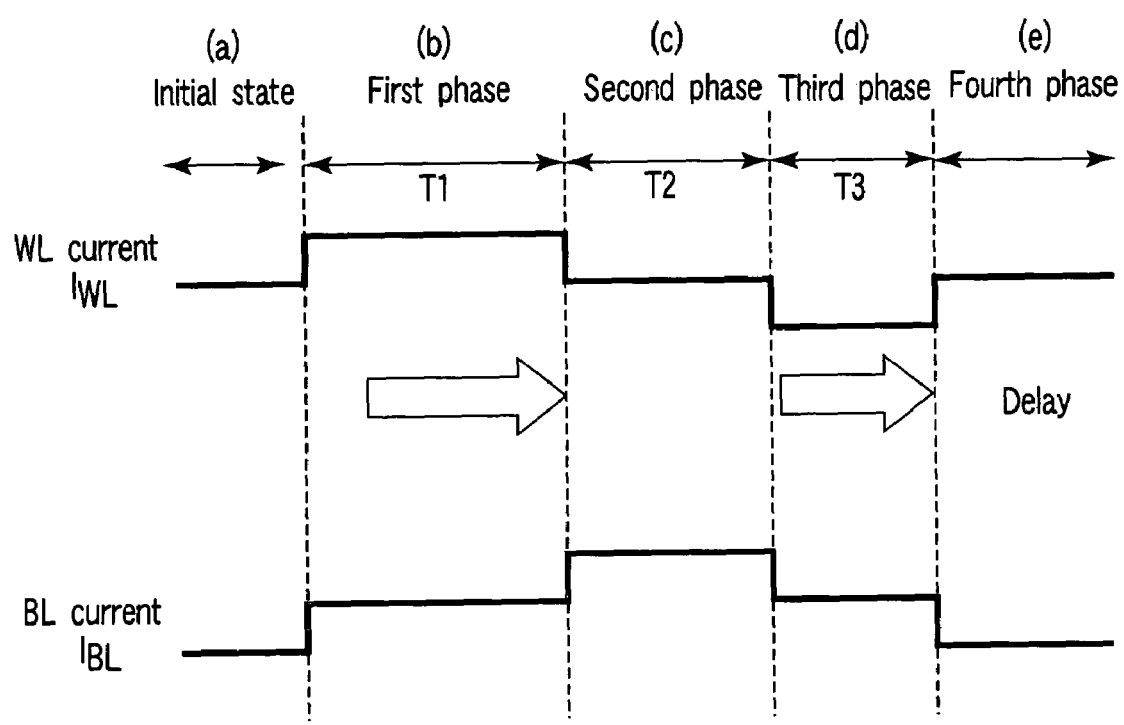
FIG. 21 is a graph showing the waveforms of write currents of Write Method Example 5 according to the embodiment of the present invention.

FIG. 21 is a graph showing the waveforms of write currents of Write Method Example 5 according to the embodiment of the present invention.

As shown in FIG. 21, Write Method Example 5 is different from Write Method Example 1 in that the times T1, T2, and T3 of the first to third phases become shorter in this order. Hence, the time to supply the write currents $I_{WL}$ and $I_{BL}$ is controlled such that time T1 of first phase>time T2 of second phase>time T3 of third phase.

According to Write Method Example 5, the same effect as in Write Method Example 1 can be obtained. In addition, since the write current supply time is longer in an early phase which triggers magnetization reversal, the magnetization reversal efficiency can be increased.

In Write Method Examples 1, 2, 3, and 5, the magnitudes of the write currents $I_{WL}$ and $I_{BL}$ supplied to the word line WL and bit line BL in the third phase may be either the same as in the first phase or different. If the magnitude is to be changed, the magnitude in the first phase is preferably larger than in the third phase. Similarly, in Write Method Example 4, the magnitudes of the write currents $I_{WL}$ and $I_{BL}$ supplied to the word line WL and bit line BL in the fourth phase may be either the same as in the second phase or different. If the magnitude is to be changed, the magnitude in the second phase is preferably larger than in the fourth phase. This is because magnetization reversal readily occurs when the current magnetic field is large in the first phase.

In Write Method Examples 1, 2, 3, and 5, the magnitude of the write current $I_{WL}$ supplied to the word line WL and that of the write current $I_{BL}$ supplied to the bit line BL in the first and third phases may be either the same or different. If the write currents have different magnitudes, $I_{WL}>I_{BL}$ is preferable. Similarly, in Write Method Example 4, the magnitude of the write current $I_{WL}$ supplied to the word line WL and that of the write current $I_{BL}$ supplied to the bit line BL in the second and fourth phases may be either the same or different. If the write currents have different magnitudes, $I_{WL}>I_{BL}$ is preferable.

In Write Method Examples 1, 2, 3, and 5, the direction of the write current $I_{BL}$ supplied to the bit line BL is preferably the same in the first to third phases. Similarly, in Write Method Example 4, the direction of the write current $I_{BL}$ supplied to the bit line BL is preferably the same in the first to fourth phases.

In Write Method Example 1 and the like, the phase is <magnetic field applied in 45° direction with respect to easy-axis direction→magnetic field applied in 0° direction with respect to easy-axis direction→magnetic field applied in −45° (315°) direction with respect to easy-axis direction>. Instead, the following phase may be employed by changing the directions of the word line current and bit line current.

For example, the phase may be <magnetic field applied in −45° (135°) direction with respect to easy-axis direction→magnetic field applied in 0° direction with respect to easy-axis direction→magnetic field applied in 45° direction with respect to easy-axis direction>. The phase may be <magnetic field applied in 135° direction with respect to easy-axis direction→magnetic field applied in 180° direction with respect to easy-axis direction→magnetic field applied in 225° direction with respect to easy-axis direction>. The phase may be <magnetic field applied in 225° direction with respect to easy-axis direction→magnetic field applied in 180° direction with respect to easy-axis direction→magnetic field applied in 135° direction with respect to easy-axis direction>.

In Write Method Example 1 and the like, when the magnetic field is applied in the 45° direction with respect to the easy-axis direction, the angle need not always be 45°. The angle needs to only be within the range of about 45°±15° (30° to 60°).

(2) Read Method

The read operation is executed in the following way. The bit line BL and word line WL corresponding to the selected MTJ element 10 are selected. A read current Ir is supplied to the MTJ element 10. When the relative magnetization directions of the recording layer (the ferromagnetic layer on the side of the fixed layer) and fixed layer (the ferromagnetic layer on the side of the storage layer when the fixed layer is made of a plurality of ferromagnetic layers divided by nonmagnetic layers) of the MTJ element 10 are in the parallel state (e.g., "1" state), the resistance is low. In the anti-parallel state (e.g., "0" state), the resistance is high. The "1" or "0" state of the MTJ element 10 is determined by reading the difference in resistance value.

[4] Structure of Peripheral Circuit

The peripheral circuits of the magnetic random access memory according to the embodiment of the present invention will be described.

(1) Overall Arrangement (1-1) Structural Example 1

Figure 22:
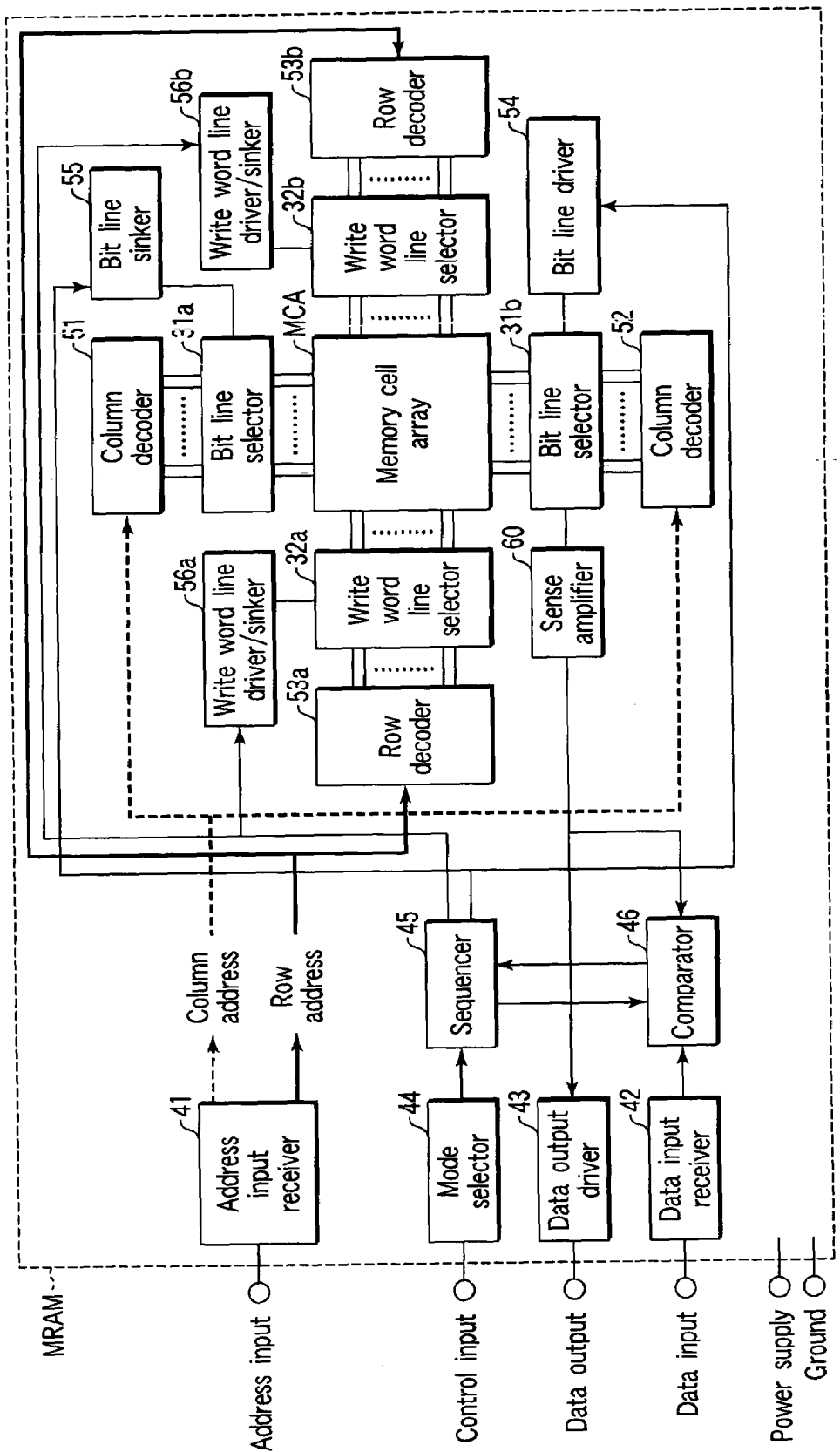
FIG. 22 is a schematic block diagram showing overall Structural Example 1 of bit line shared magnetic random access memory according to the embodiment of the present invention.
Figure 23:
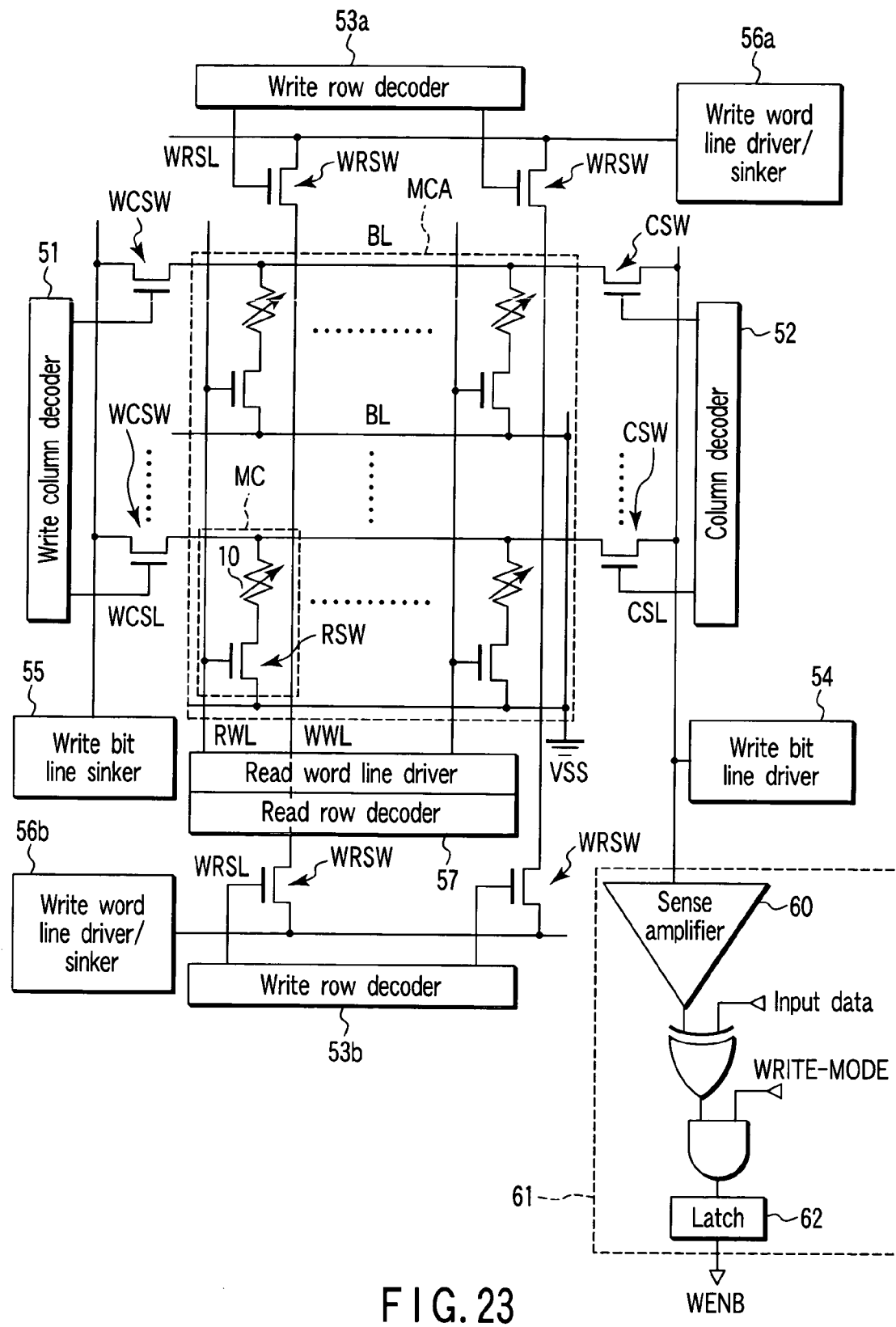
FIG. 23 is a schematic block diagram showing Structural Example 1 around a memory cell of the bit line shared magnetic random access memory according to the embodiment-of the present invention.

FIG. 22 is a schematic block diagram of overall Structural Example 1 of the magnetic random access memory according to the embodiment of the present invention. FIG. 23 is a schematic block diagram of Structural Example 1 around a memory cell of the magnetic random access memory according to the embodiment of the present invention. In Structural Example 1, one bit line in one cell functions as both the write wiring and the read wiring, like, e.g., the cell structure shown in FIG. 1 (to be referred to as a bit line shared structure hereinafter).

As shown in FIG. 22, a magnetic random access memory MRAM having a bit line shared structure includes a memory cell array MCA, bit line selectors 31a and 31b, write word line selectors 32a and 32b, column decoders 51 and 52, row decoders 53a and 53b, bit line driver 54, bit line sinker 55, write word line drivers/sinkers 56a and 56b, sense amplifier 60, address input receiver 41, data input receiver 42, data output driver 43, mode selector 44, sequencer 45, and comparator 46.

The address input receiver 41 receives an address signal, transfers column address signals to the column decoders 51 and 52, and row address signals to the row decoders 53a and 53b. The data input receiver 42 receives input data and transfers it to the comparator 46. The data output driver 43 outputs read data detected by the sense amplifier 60 externally from the magnetic random access memory MRAM.

The mode selector 44 receives a control signal and transfers it to the sequencer 45. The sequencer 45 sends control signals to the bit line driver 54, bit line sinker 55, and write word line drivers/sinkers 56a and 56b in accordance with the result from the comparator 46.

Referring to FIG. 23, write column select switches WCSW are included in the bit line selectors 31a and 31b shown in FIG. 22. Write row select switches WRSW are included in the write word line selectors 32a and 32b shown in FIG. 22.

(1-2) Structural Example 2

Figure 25:
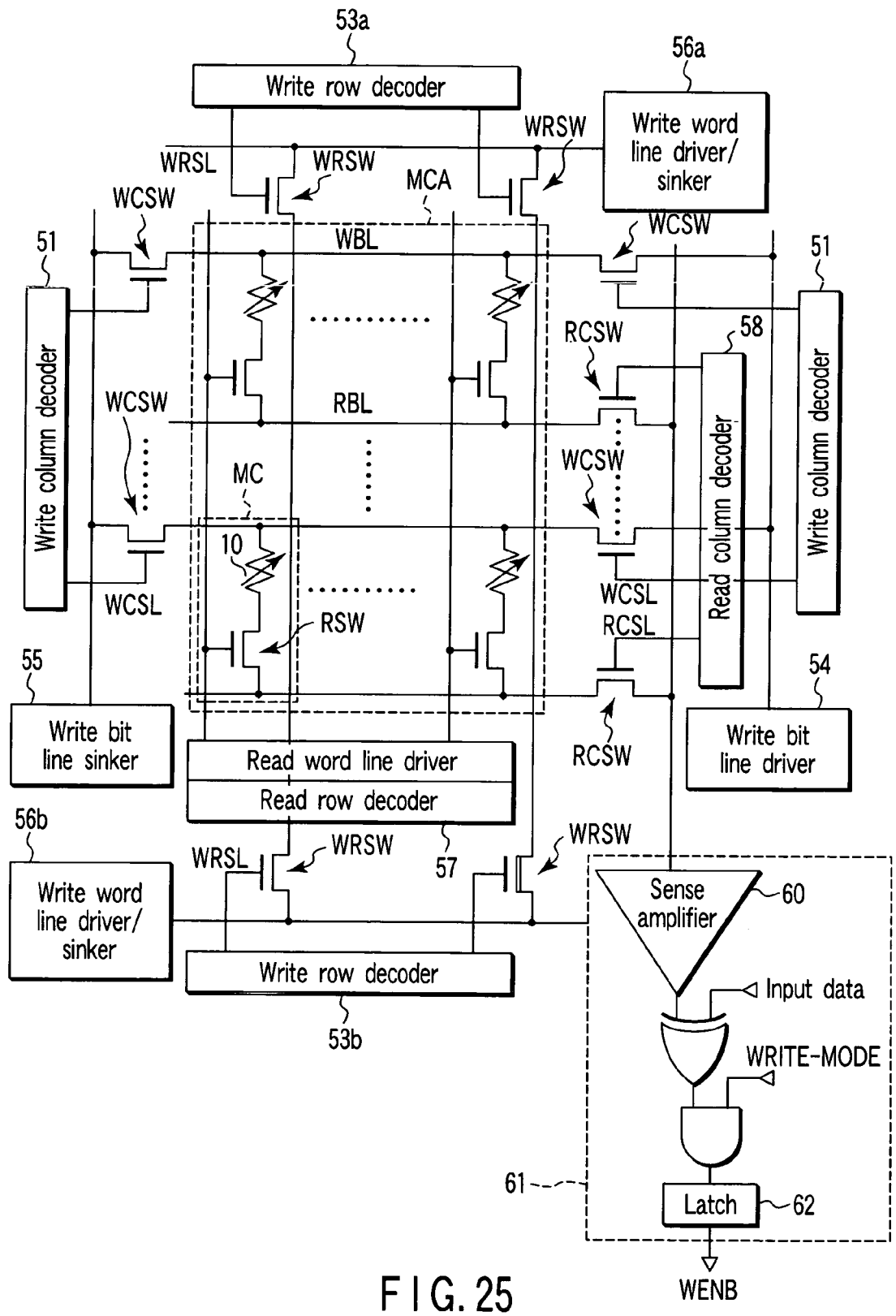
FIG. 25 is a schematic block diagram showing Structural Example 2 around a memory cell of the bit line divided magnetic random access memory according to the embodiment of the present invention.

FIG. 24 is a schematic block diagram of overall Structural Example 2 of the magnetic random access memory according to the embodiment of the present invention. FIG. 25 is a schematic block diagram of Structural Example 2 around a memory cell of the magnetic random access memory according to the embodiment of the present invention. In Structural Example 2, a bit line in one cell is divided into a write bit line and a read bit line, like, e.g., the cell structure shown in FIG. 4 (to be referred to as a bit line divided structure hereinafter).

As shown in FIG. 24, the magnetic random access memory MRAM having the bit line divided structure is different from the magnetic random access memory having the bit line shared structure shown in FIG. 22 in that a read bit line selector 33 is added.

More specifically, as shown in FIG. 25, the bit line BL is divided into the write bit line WBL and the read bit line RBL. The read bit line RBL is connected to a read column decoder 58 through a read column select switch RCSW.

(2) Peripheral Circuit

The structures of peripheral circuits arranged around the above-described memory cell array MCA will be described below in detail.

(2-1) Write Column Decoder

Figure 26:
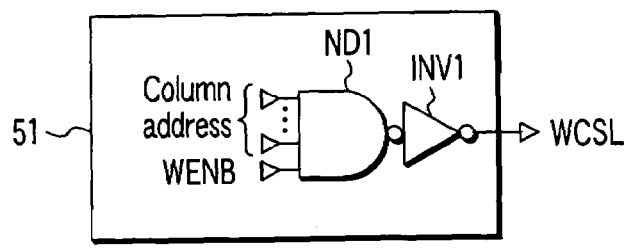
FIG. 26 is a circuit diagram showing a write column decoder according to the embodiment of the present invention.

FIG. 26 is a circuit diagram of the write column decoder according to the embodiment of the present invention.

As shown in FIG. 26, the write column decoder 51 includes a NAND circuit ND1 and inverter circuit INV1.

Column address signals and a write enable signal WENB are input to the NAND circuit ND1. The output signal from the NAND circuit ND1 is input to the inverter circuit INV1. The inverter circuit INV1 outputs a write column select line signal WCSL. By the write column select line signal WCSL, the write column select switch WCSW shown in FIGS. 23 and 25 is controlled so that an arbitrary bit line BL is selected.

(2-2) Column Decoder

Figure 27:
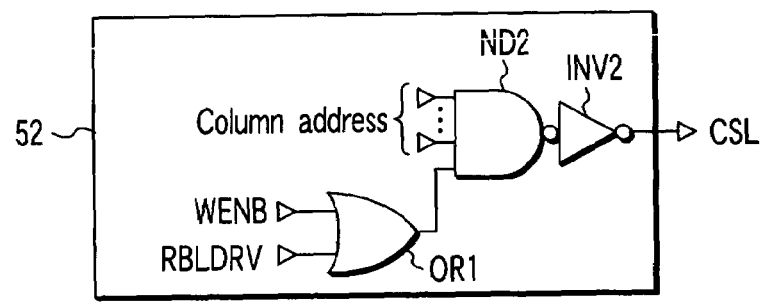
FIG. 27 is a circuit diagram showing a column decoder according to the embodiment of the present invention.

FIG. 27 is a circuit diagram of a column decoder according to the embodiment of the present invention.

As shown in FIG. 27, the column decoder 52 includes an OR circuit OR1, NAND circuit ND2, and inverter circuit INV2.

The write enable signal WENB and a read bit line driver signal RBLDRV are input to the OR circuit OR1. The output signal from the OR circuit OR1 and column address signals are input to the NAND circuit ND2. The output signal from the NAND circuit ND2 is input to the inverter circuit INV2. The inverter circuit INV2 outputs a column select line signal CSL. By the column select line signal CSL, a column select switch CSW shown in FIG. 23 is controlled so that an arbitrary bit line BL is selected.

(2-3) Write Row Decoder

Figure 28:
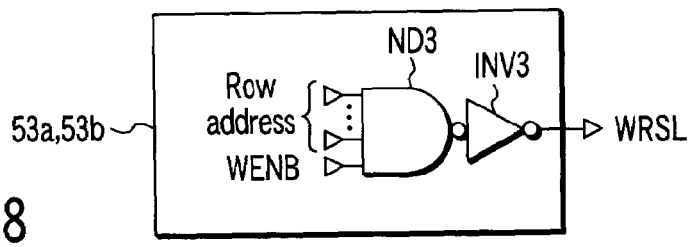
FIG. 28 is a circuit diagram showing a write row decoder according to the embodiment of the present invention.

FIG. 28 is a circuit diagram of the write row decoder according to the embodiment of the present invention.

As shown in FIG. 28, each of the write row decoders 53a and 53b includes a NAND circuit ND3 and inverter circuit INV3.

Row address signals and the write enable signal WENB are input to the NAND circuit ND3. The output signal from the NAND circuit ND3 is input to the inverter circuit INV3. The inverter circuit INV3 outputs a write row select line signal WRSL. By the write row select line signal WRSL, the write row select switch WRSW shown in FIGS. 23 and 25 is controlled so that an arbitrary write word line WWL is selected.

(2-4) Write Bit Line Sinker (2-4a) Structural Example 1

Figure 29A:
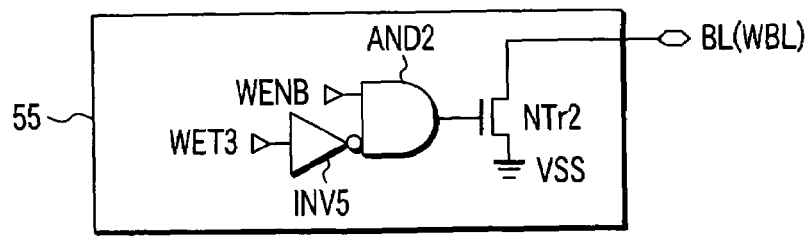
FIGS. 29A and 29B are circuit diagrams showing write bit line sinkers according to the embodiment of the present invention.

FIG. 29A is a circuit diagram of Structural Example 1 of the write bit line sinker according to the embodiment of the present invention. Structural Example 1 is an example when, e.g., Write Method Example 1, 2, or 5 is executed.

As shown in FIG. 29A, the write bit line sinker 55 of Structural Example 1 includes an inverter circuit INV5, AND circuit AND2, and NMOS transistor NTr2.

A timing signal WET3 is input to the inverter circuit INV5. The output signal from the inverter circuit INV5 and the write enable signal WENB are input to the AND circuit AND2. The output signal from the AND circuit AND2 is supplied to the gate of the NMOS transistor NTr2 to control it. One end of the current path of the NMOS transistor NTr2 is connected to the ground terminal VSS. The other end of the current path is connected to the bit line BL. The write bit line sinker 55 absorbs the write current $I_{BL}$ supplied to the bit line BL.

(2-4b) Structural Example 2

Figure 29B:
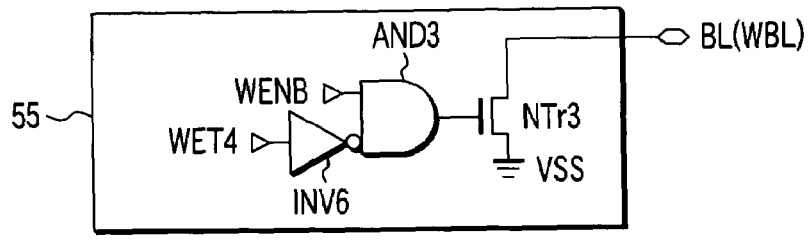

FIG. 29B is a circuit diagram of Structural Example 2 of the write bit line sinker according to the embodiment of the present invention. Structural Example 2 is an example when, e.g., Write Method As shown in FIG. 29B, the write bit line sinker 55 of Structural Example 2 includes an inverter circuit INV6, AND circuit AND3, and NMOS transistor NTr3.

In Structural Example 1, the timing signal WET3 is input to the inverter circuit INV5. In Structural Example 2, a timing signal WET4 is input to the inverter circuit INV6.

(2-5) Write Bit Line Driver (2-5a) Structural Example 1

Figure 30A:
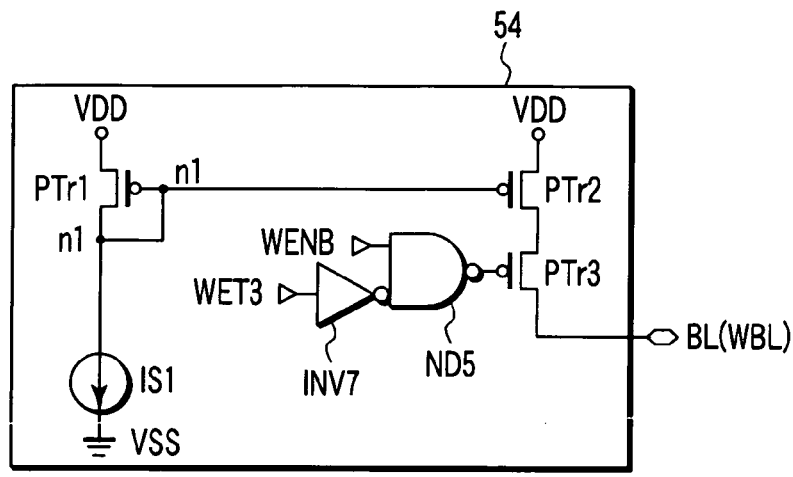
FIGS. 30A to 30C are circuit diagrams showing write bit line drivers according to the embodiment of the present invention.

FIG. 30A is a circuit diagram of Structural Example 1 of the write bit line driver according to the embodiment of the present invention. Structural Example 1 is an example when, e.g., Write Method Example 2 is executed.

As shown in FIG. 30A, the write bit line driver 54 of Structural Example 1 includes an inverter circuit INV7, NAND circuit ND5, PMOS transistors PTr1, PTr2, and PTr3, and current source IS1.

The timing signal WET3 is input to the inverter circuit INV7. The output signal from the inverter circuit INV7 and the write enable signal WENB are input to the NAND circuit ND5. The output signal from the NAND circuit ND5 is supplied to the gate of the PMOS transistor PTr3 to control it.

One terminal of the current source IS1 is connected to the ground terminal VSS. The other terminal of the current source IS1 is connected to a node n1. The gate of the PMOS transistor PTr1 is connected to a node n1. One end of the current path of the PMOS transistor PTr1 is connected to node n1. The other end of the current path is connected to a power supply terminal VDD. The gate of the PMOS transistor PTr2 is connected to the node n1. One end of the current path of the PMOS transistor PTr2 is connected to one end of the current path of the PMOS transistor PTr3. The other end of the current path of the PMOS transistor PTr2 is connected to the power supply terminal VDD. The other end of the current path of the PMOS transistor PTr3 is connected to the bit line BL.

The write bit line driver 54 supplies the write current $I_{BL}$ to the bit line BL by controlling the PMOS transistors PTr1, PTr2, and PTr3.

(2-5b) Structural Example 2

Figure 30B:
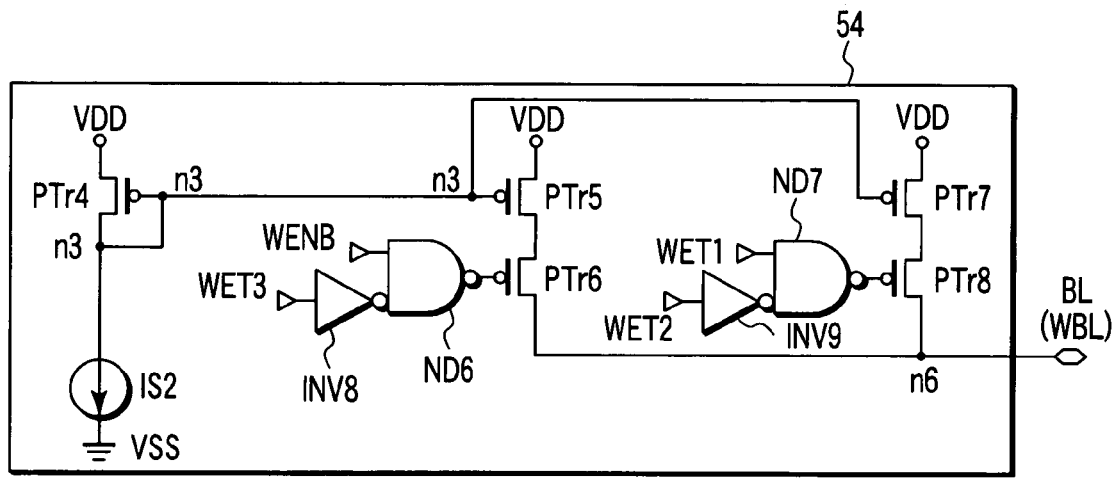

FIG. 30B is a circuit diagram of Structural Example 2 of the write bit line driver according to the embodiment of the present invention. Structural Example 2 is an example when, e.g., Write Method Example 1 is executed.

As shown in FIG. 30B, the write bit line driver 54 of Structural Example 2 includes inverter circuits INV8 and INV9, NAND circuits ND6 and ND7, PMOS transistors PTr4, PTr5, PTr6, PTr7, and PTr8, and current source IS2.

In Structural Example 2, two control circuits each including the inverter circuit INV7, NAND circuit ND5, PMOS transistors PTr2 and PTr3 of Structural Example 1 are present. Structural Example 2 is different from Structural Example 1 in the following points.

A timing signal WET2 is input to the inverter circuit INV9. The output signal from the inverter circuit INV9 and the timing signal WET1 are input to the NAND circuit ND7. The output signal from the NAND circuit ND7 is supplied to the gate of the PMOS transistor PTr8 to control it.

The gate of the PMOS transistor PTr7 is connected to a node n3. One end of the current path of the PMOS transistor PTr7 is connected to one end of the current path of the PMOS transistor PTr8. The other end of the current path of the PMOS transistor PTr7 is connected to the power supply terminal VDD. The other end of the current path of the PMOS transistor PTr8 is connected to a node n6. The node n6 is a bit line BL.

(2-5c) Structural Example 3

Figure 30C:
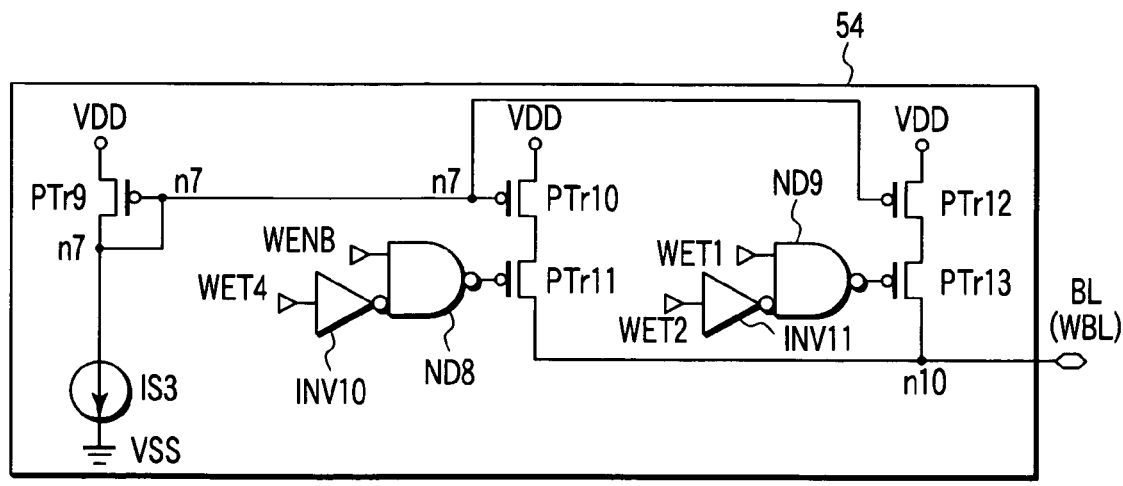

FIG. 30C is a circuit diagram of Structural Example 3 of the write bit line driver according to the embodiment of the present invention. Structural Example 3 is an example when, e.g., Write Method Example 3 is executed.

As shown in FIG. 30C, the write bit line driver 54 of Structural Example 3 includes inverter circuits INV10 and INV11, NAND circuits ND8 and ND9, PMOS transistors PTr9, PTr10, PTr11, PTr12, and PTr13, and current source IS3.

In Structural Example 2, the timing signal WET3 is input to the inverter circuit INV8. In Structural Example 3, the timing signal WET4 is input to the inverter circuit INV10.

(2-6) Write Word Line Driver/Sinker

Figure 31A:
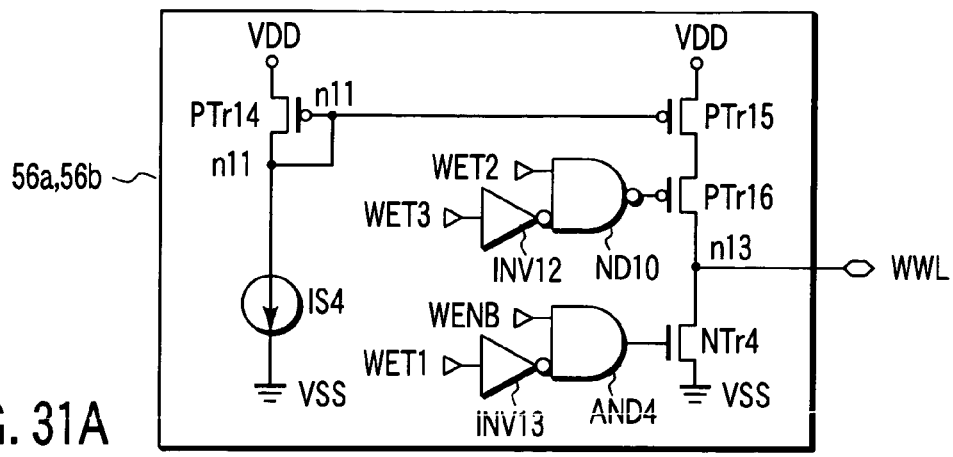
FIGS. 31A and 31D are circuit diagrams showing write word line drivers/sinkers according to the embodiment of the present invention.
Figure 31B:
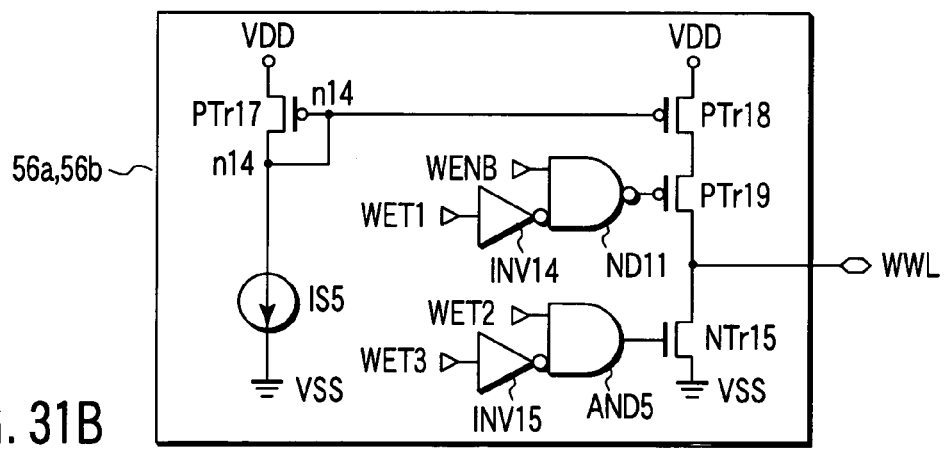

FIGS. 31A and 31B are circuit diagrams of the write word line drivers/sinkers according to the embodiment of the present invention.

As shown in FIG. 31A, the write word line driver/sinker (upper side) 56a or 56b includes inverter circuits INV12 and INV13, NAND circuit ND10, AND circuit AND4, PMOS transistors PTr14, PTr15, and PTr16, NMOS transistor NTr4, and current source IS4.

The timing signal WET3 is input to the inverter circuit INV12. The output signal from the inverter circuit INV12 and the timing signal WET2 are input to the NAND circuit ND10. The output signal from the NAND circuit ND10 is supplied to the gate of the PMOS transistor PTr16 to control it.

The timing signal WET1 is input to the inverter circuit INV13. The output signal from the inverter circuit INV13 and the write enable signal WENB are input to the AND circuit AND4. The output signal from the AND circuit AND4 is supplied to the gate of the NMOS transistor NTr4 to control it.

One terminal of the current source IS4 is connected to the ground terminal VSS. The other terminal of the current source IS4 is connected to a node n11. The gate of the PMOS transistor PTr14 is connected to a node n11. One end of the current path of the PMOS transistor PTr14 is connected to the node n11. The other end of the current path is connected to the power supply terminal VDD. The gate of the PMOS transistor PTr15 is connected to the node n11. One end of the current path of the PMOS transistor PTr15 is connected to one end of the current path of the PMOS transistor PTr16. The other end of the current path of the PMOS transistor PTr15 is connected to the power supply terminal VDD. The other end of the current path of the PMOS transistor PTr16 is connected to a node n13. One end of the current path of the NMOS transistor NTr4 is connected to the ground terminal VSS. The other end of the current path is connected to the node n13. The node n13 is a write word line WWL.

The write word line driver/sinker 56a or 56b supplies the write current $I_{WL}$ to the write word line WWL or absorbs the write current $I_{WL}$ flowing to the write word line WWL.

As shown in FIG. 31B, the write word line driver/sinker (lower side) 56a or 56b includes inverter circuits INV14 and INV15, NAND circuit ND11, AND circuit AND5, PMOS transistors PTr17, PTr18, and PTr19, NMOS transistor NTr5, and current source IS5.

The write word line driver/sinker (lower side) 56a or 56b is different from the write word line driver/sinker (upper side) 56a or 56b in that the timing signal WET1 is input to the inverter circuit INV14, the timing signal WET3 is input to the inverter circuit INV15, the write enable signal WENB is input to the NAND circuit ND10, and the timing signal WET2 is input to the AND circuit AND5.

(2-7) Read Word Line Driver and Read Row Decoder

Figure 32:
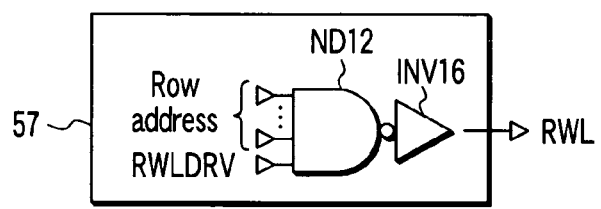
FIG. 32 is a circuit diagram showing a read word line driver and read row decoder according to the embodiment of the present invention.

FIG. 32 is a circuit diagram of a read word line driver and read row decoder according to the embodiment of the present invention.

As shown in FIG. 32, a read word line driver & read row decoder 57 includes a NAND circuit ND12 and inverter circuit INV16.

Row address signals and a read word line driver signal RWLDRV are input to the NAND circuit ND12. The output signal from the NAND circuit ND12 is input to the inverter circuit INV16. The output terminal of the inverter circuit INV16 is connected to the read word line RWL.

Figure 33:
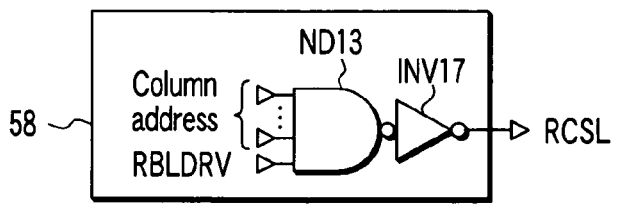
FIG. 33 is a circuit diagram showing a read column decoder according to the embodiment of the present invention.

Hence, the read word line RWL corresponding to the row address signal is selected so that the read switching element RSW shown in FIGS. 23 and 25 is (2-8) Read Column Decoder FIG. 33 is a circuit diagram of the read column decoder according to the embodiment of the present invention.

As shown in FIG. 33, the read column decoder 58 includes a NAND circuit ND13 and inverter circuit INV17.

Column address signals and the read bit line driver signal RBLDRV are input to the NAND circuit ND13. The output signal from the NAND circuit ND13 is input to the inverter circuit INV17. The inverter circuit INV17 outputs a read column select line signal RCSL. By the read column select line signal RCSL, the read column select switch RCSW shown in FIG. 25 is controlled so that an arbitrary read bit line RBL is selected.

(2-9) Sense Amplifier

FIG. 34 is a circuit diagram of the sense amplifier according to the embodiment of the present invention. FIG. 35 is a circuit diagram of a VCLMP circuit according to the embodiment of the present invention.

As shown in FIG. 34, the sense amplifier 60 includes an inverter circuit INV18, PMOS transistors PTr20, PTr21, and PTr22, NMOS transistor NTr6 and current source IS6.

The read word line driver signal RWLDRV is input to the inverter circuit INV18. The output signal from the inverter circuit INV18 is supplied to the gate of the PMOS transistor PTr22 to control it.

One terminal of the current source IS6 is connected to the ground terminal VSS. The other terminal of the current source IS6 is connected to a node n17. The gate of the PMOS transistor PTr20 is connected to a node n17. One end of the current path of the PMOS transistor PTr20 is connected to the node n17. The other end of the current path of the PMOS transistor PTr20 is connected to the power supply terminal VDD. The gate of the PMOS transistor PTr21 is connected to the node n17. One end of the current path of the PMOS transistor PTr21 is connected to one end of the current path of the PMOS transistor PTr22. The other end of the current path of the PMOS transistor PTr21 is connected to the power supply terminal VDD. The other end of the current path of the PMOS transistor PTr22 is connected to one end of the current path of the NMOS transistor NTr6. The other end of the current path of the NMOS transistor NTr6 is connected to the column select switch CSW (RCSW). A clamp signal VCLMP is supplied to the gate of the NMOS transistor NTr6.

As shown in FIG. 35, a clamp signal generation circuit 63 which generates the clamp signal VCLMP includes a differential amplifier DP1, PMOS transistors PTr23 and PTr24, resistor R, and current source IS7.

The positive input terminal of the differential amplifier DP1 is connected to a node n21. The negative input terminal and output terminal of the differential amplifier DP1 are connected to a node n22. The resistor R is connected between the node n21 and the ground terminal VSS.

One terminal of the current source IS7 is connected to the ground terminal VSS. The other terminal of the current source IS7 is connected to a node n19. The gate of the PMOS transistor PTr23 is connected to a node n19. One end of the current path of the PMOS transistor PTr23 is connected to the node n19. The other end of the current path of the PMOS transistor PTr23 is connected to the power supply terminal VDD. The gate of the PMOS transistor PTr24 is connected to the node n19. One end of the current path of the PMOS transistor PTr24 is connected to the node n21. The other end of the current path of the PMOS transistor PTr24 is connected to the power supply terminal VDD.

(2-10) Read Circuit

FIG. 36 is a circuit diagram of a read circuit according to the embodiment of the present invention.

As shown in FIG. 36, a read circuit 61 include an exclusive OR circuit EXOR, AND circuit AND0, and latch circuit 62. The latch circuit 62 includes inverter circuits INV19 and INV20, AND circuit AND6, and switches SW1 and SW2.

An input data signal and the output signal from the sense amplifier 60 are input to the exclusive OR circuit EXOR. The output signal from the exclusive OR circuit EXOR and a write mode signal WRITE-MODE are input to the AND circuit AND0. The output signal from the AND circuit AND0 is supplied to one terminal of the switch SW1. The other terminal of the switch SW1 is connected to a node n23. One terminal of the switch SW2 is connected to the node n23. The other terminal of the switch SW2 is connected to a node n24. The input terminal of the inverter circuit INV19 is connected to the node n23. The output terminal of the inverter circuit INV19 is connected to the input terminal of the inverter circuit INV20. The output terminal of the inverter circuit INV20 is connected to the node n24. The output signal from the inverter circuit INV20 and signal RDLCH are input to the AND circuit AND6. The AND circuit AND6 outputs the write enable signal WENB.

(2-11) Timing Generation Circuit

FIG. 37 is a circuit diagram of a timing generation circuit according to the embodiment of the present invention.

As shown in FIG. 37, the timing generation circuit 64 has first to fourth timing generation circuits 64a, 64b, 64c, and

64*d*. The fourth timing generation circuit 64*d* is not always necessary and is arranged in accordance with the write method.

The first timing generation circuit 64*a* includes a delay circuit 65*a*, NAND circuit ND14, and inverter circuit INV21. The write enable signal WENB is supplied to the delay circuit 65*a*. The output signal corresponding to a delay time τ1 of the delay circuit 65*a* and the write enable signal WENB are supplied to the input terminal of the NAND circuit ND14. The output signal from the NAND circuit ND14 is input to the inverter circuit INV21. The inverter circuit INV21 outputs the timing signal WET1.

The second timing generation circuit 64*b* includes a delay circuit 65*b*, NAND circuit ND15, and inverter circuit INV22. The timing signal WET1 is supplied to the delay circuit 65*b*. The output signal corresponding to a delay time τ2 of the delay circuit 65*b* and the timing signal WET1 are supplied to the input terminal of the NAND circuit ND15. The output signal from the NAND circuit ND15 is input to the inverter circuit INV22. The inverter circuit INV22 outputs the timing signal WET2.

The third timing generation circuit 64*c* includes a delay circuit 65*c*, NAND circuit ND16, and inverter circuit INV23. The timing signal WET2 is supplied to the delay circuit 65*c*. The output signal corresponding to a delay time τ3 of the delay circuit 65*c* and the timing signal WET2 are supplied to the input terminal of the NAND circuit ND16. The output signal from the NAND circuit ND16 is input to the inverter circuit INV23. The inverter circuit INV23 outputs the timing signal WET3.

The fourth timing generation circuit 64*d* includes a delay circuit 65*d*, NAND circuit ND17, and inverter circuit INV24. The timing signal WET3 is supplied to the delay circuit 65*d*. The output signal corresponding to a delay time τ4 of the delay circuit 65*d* and the timing signal WET3 are supplied to the input terminal of the NAND circuit ND17. The output signal from the NAND circuit ND17 is input to the inverter circuit INV24. The inverter circuit INV24 outputs the timing signal WET4.

(2-12) Delay Circuit

Figure 38A:
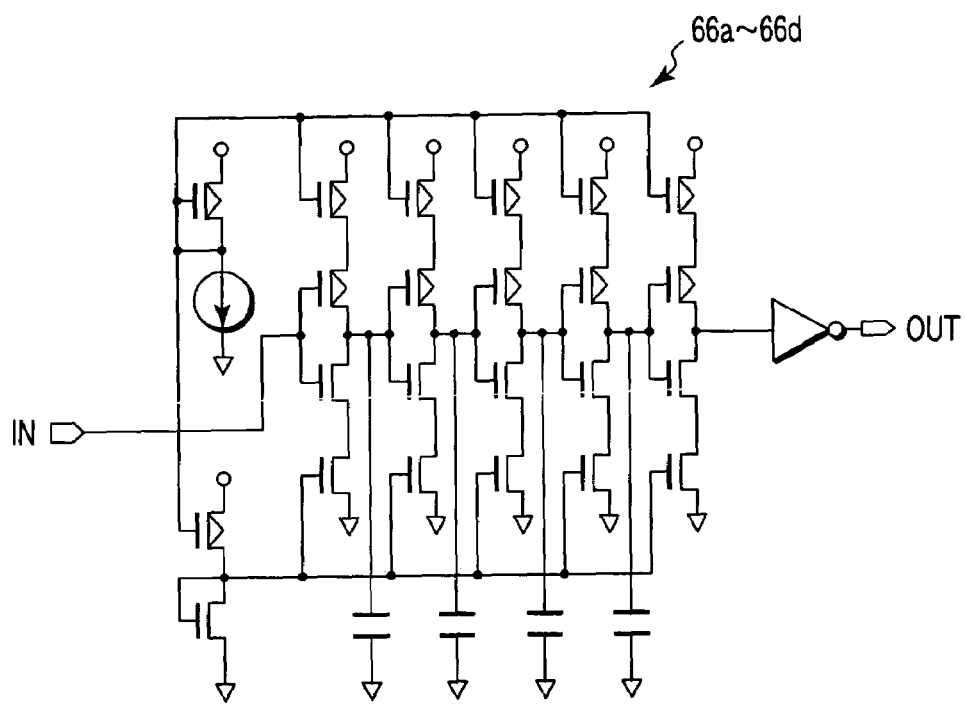
FIGS. 38A and 38B are circuit diagrams showing delay circuits using current sources according to the embodiment of the present invention.
Figure 38B:
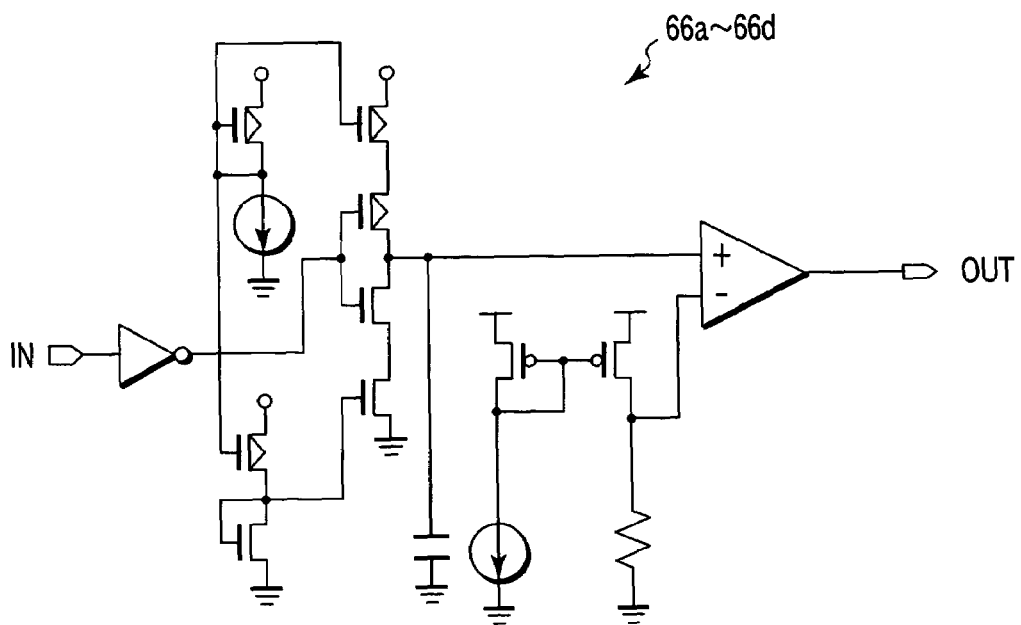

FIGS. 38A and 38B are circuit diagrams of delay circuits using current sources according to the embodiment of the present invention.

The delay circuits using the current sources, which are shown in FIGS. 38A and 38B, are examples of the delay circuits 65*a*, 65*b*, 65*c*, and 65*d* of the timing generation circuit 64.

In the delay circuit shown in FIG. 38A, when the capacitance is charged by a current, and a predetermined potential is obtained, the inverter is inverted to propagate a signal. When the current amount is changed, the delay time can be changed. On the other hand, the delay circuit shown in FIG. 38B does not depend on the power supply voltage and temperature. A comparison circuit such as a differential amplifier is necessary in place of an inverter.

(2-13) Constant Current Source Circuit

Figure 39:
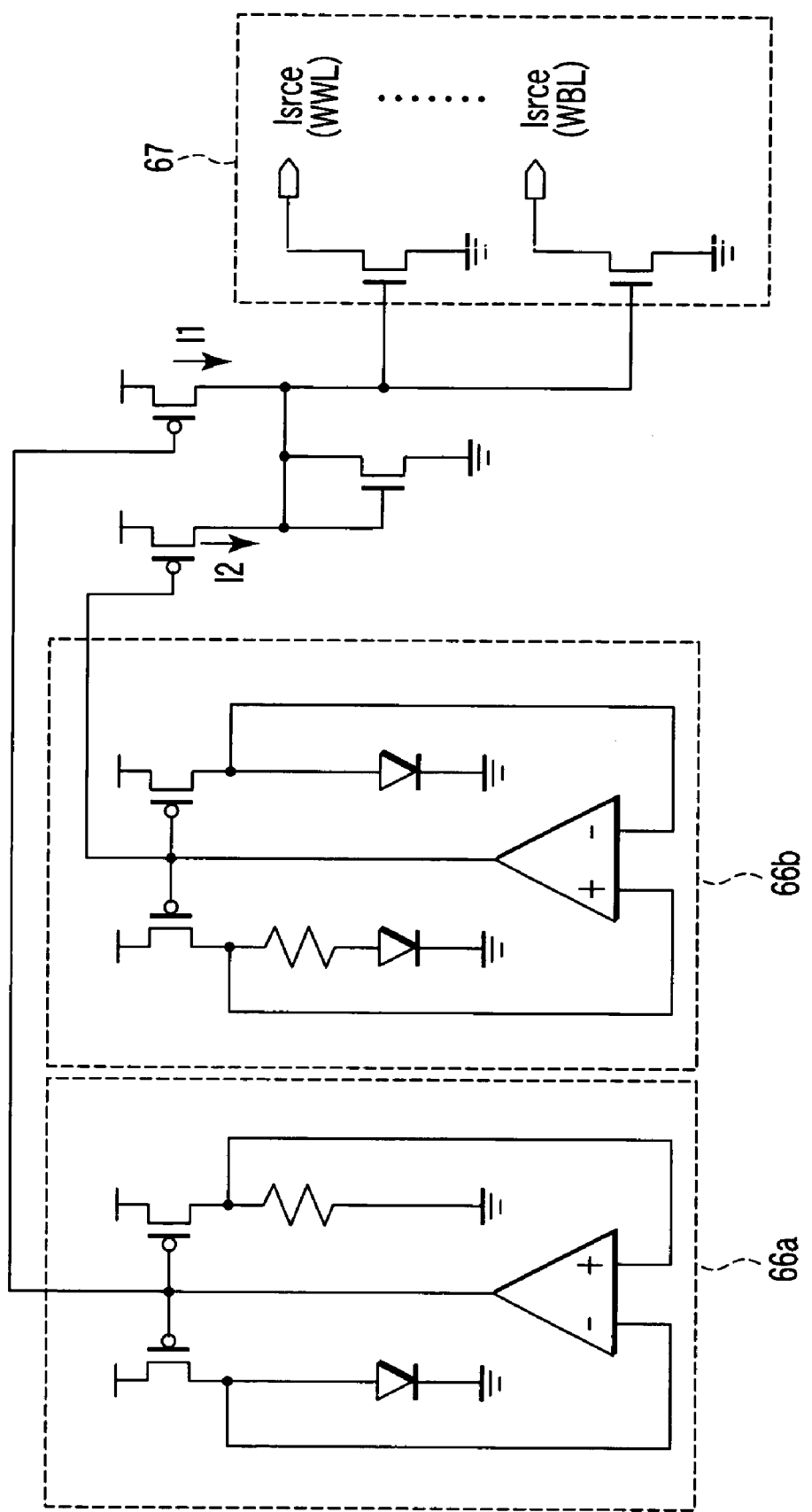
FIG. 39 is a circuit diagram showing a constant current source circuit according to the embodiment of the present invention.

FIG. 39 is a circuit diagram of a constant current source circuit according to the embodiment of the present invention.

As shown in FIG. 39, the constant current source circuit is a current source using BGR (Band Gap Reference) and functions as the current source of a write current driver or the current source of a delay circuit.

As a characteristic of a first current source 66*a*, the current decreases as the temperature increases. As a characteristic of a second current source 66*b*, the current increases as the temperature increases. When a current I1 corresponding to the current of the first current source 66*a* and a current I2 corresponding to the current of the second current source 66*b* are added, the temperature dependence can be suppressed. Output circuits 67 are necessary equal in number to necessary current sources.

(3) Write Operation

FIG. 40 is a timing chart of a write operation according to the embodiment of the present invention. In this chart, solid lines of signal WENB, WET1, WET2 and WET4 indicate a case in which read data and write data are different, i.e., a case in which a data rewrite is necessary. Broken lines of signal WENB, WET1, WET2 and WET4 indicate a case in which read data coincides with write data, i.e., a case in which no data rewrite is necessary.

As shown in FIG. 40, first, an external control signal/WE (Write Enable) goes low level. Then, an external control signal/CE (Chip Enable) goes low level, and the write mode signal WRITE-MODE goes high level. Next, the read word line driver signal RWLDRV goes high level. Data which is already written in the MTJ element 10 is read out by a sense amplifier enable signal SAEN, and the read result is latched.

If the read data and write data are different, the write enable signal WENB goes high level. The above-described write operation is executed while controlling the timing signals WET1, WET2, WET3, and WET4. If the read data coincides with the write data, the data need not be rewritten. Hence, no write operation is executed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data write method of a magnetic random access memory including
    a magnetoresistive element which has an axis of easy magnetization and an axis of hard magnetization,
    a first write wiring which runs in a direction of the axis of easy magnetization, and
    a second write wiring which runs in a direction of the axis of hard magnetization, comprising:
    a first phase of supplying a first current to the first write wiring in a first direction and supplying a second current to the second write wiring in a second direction;
    a second phase of stopping supplying the first current to the first write wiring and supplying the second current to the second write wiring in the second direction; and
    a third phase of supplying the first current to the first write wiring in a third direction reverse to the first direction and supplying the second current to the second write wiring in the second direction.

2. The method according to claim 1, wherein when first data is to be written in the magnetoresistive element,
    data stored in the magnetoresistive element is read out before the first phase, and the first phase, second phase, and third phase are executed when the stored data is different from the first data.

3. The method according to claim 1, further comprising, after the third phase, a fourth phase of stopping supplying the first current and the second current to the first write wiring and the second write wiring.

4. The method according to claim 1, wherein the second current in the second phase is larger than the second current in the first phase and third phase.

5. The method according to claim 1, wherein the second current in the first phase, the second current in the second phase, and the second current in the third phase equal each other.

6. The method according to claim 1, further comprising, after the third phase, a fourth phase of stopping supplying the first current to the first write wiring and supplying the second current to the second write wiring in the second direction.

7. The method according to claim 6, wherein a time of the fourth phase is shorter than any of a time of the first phase, a time of the second phase, and a time of the third phase.

8. The method according to claim 1, further comprising, after the third phase, a fourth phase of supplying the first current to the first write wiring in the third direction and stopping supplying the second current to the second write wiring.

9. The method according to claim 8, wherein a time of the fourth phase is shorter than any of a time of the first phase, a time of the second phase, and a time of the third phase.

10. The method according to claim 1, further comprising, before the first phase, a fourth phase of supplying the second current to the second write wiring in the second direction without supplying the first current to the first write wiring.

11. The method according to claim 10, wherein a time of the fourth phase is shorter than any of a time of the first phase, a time of the second phase, and a time of the third phase.

12. The method according to claim 1, further comprising, before the first phase, a fourth phase of supplying the first current to the first write wiring in the first direction without supplying the second current to the second write wiring.

13. The method according to claim 12, wherein a time of the fourth phase is shorter than any of a time of the first phase, a time of the second phase, and a time of the third phase.

14. The method according to claim 1, wherein a relationship T1>T2>T3 is satisfied where T1 is a time of the first phase, T2 is a time of the second phase, and T3 is a time of the third phase.

15. The method according to claim 1, wherein a time of the first phase, a time of the second phase, and a time of the third phase have a same length.

16. The method according to claim 1, wherein
in the first phase, a first magnetic field is applied to the magnetoresistive element in a 45° direction with respect to the direction of the axis of easy magnetization of the magnetoresistive element,
in the second phase, a second magnetic field is applied to the magnetoresistive element in a 0° direction with respect to the direction of the axis of easy magnetization of the magnetoresistive element, and
in the third phase, a third magnetic field is applied to the magnetoresistive element in a −45° direction with respect to the direction of the axis of easy magnetization of the magnetoresistive element.

17. The method according to claim 16, wherein the first magnetic field, second magnetic field, and third magnetic field have a same magnitude.

18. The method according to claim 16, wherein the second magnetic field is smaller than the first magnetic field and third magnetic field.

19. The method according to claim 1, wherein the magnetoresistive element comprises
a fixed layer which has a fixed magnetization,
a recording layer which has a reverse magnetization and includes a first ferromagnetic layer, a second ferromagnetic layer, and a first nonmagnetic layer sandwiched between the first ferromagnetic layer and the second ferromagnetic layer, the first ferromagnetic layer and the second ferromagnetic layer being anti-ferromagnetically coupled while making the magnetizations directed in opposite directions, and
a second nonmagnetic layer which is formed between the fixed layer and the recording layer.

20. A system comprising:
a magnetoresistive element having an axis of easy magnetization and an axis of hard magnetization;
a first write wiring running in a direction of the axis of easy magnetization; and
a second write wiring running in a direction of the axis of hard magnetization,
wherein a first current is supplied to the first write wiring in a first direction and a second current is supplied to the second write wiring in a second direction for a first phase,
the first current is stopped to the first write wiring for a second phase, and
the first current is supplied to the first write wiring in a third direction reverse to the first direction and the second current is supplied to the second write wiring in the second direction for a third phase.

* * * * *